(12) United States Patent
Nakamura et al.

(10) Patent No.: US 10,436,856 B2
(45) Date of Patent: Oct. 8, 2019

(54) MAGNETIC SENSOR APPARATUS AND CURRENT SENSOR APPARATUS

(71) Applicant: Asahi Kasei Microdevices Corporation, Tokyo (JP)

(72) Inventors: Takenobu Nakamura, Tokyo (JP); Yuusuke Aiba, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/385,875

(22) Filed: Dec. 21, 2016

(65) Prior Publication Data

US 2017/0184688 A1     Jun. 29, 2017

(30) Foreign Application Priority Data

Dec. 24, 2015 (JP) ................................. 2015-252138
May 27, 2016 (JP) ................................. 2016-106367
Dec. 7, 2016 (JP) ................................. 2016-237315

(51) Int. Cl.
*G01R 33/00*     (2006.01)
*G01R 33/07*     (2006.01)

(52) U.S. Cl.
CPC ......... *G01R 33/0041* (2013.01); *G01R 33/07* (2013.01)

(58) Field of Classification Search
CPC ............................. G01R 33/0041; G01R 33/07
See application file for complete search history.

(56) References Cited

U.S. PATENT DOCUMENTS 5,298,858 A * 3/1994 Harrison ............ G01N 27/9046
                                             324/235
5,612,613 A * 3/1997 Dutt .......................... G05F 3/24
                                             323/313
(Continued)

FOREIGN PATENT DOCUMENTS

JP      H2-120615 A      5/1990
JP      H3-39658 A      2/1991
(Continued)

OTHER PUBLICATIONS

R.S. Popovic et al., "Hall Effect Devices," Inst. of Physics Pub. Inc., May 1991, pp. 186-193, IOP Publishing Ltd, Bristol, England.
(Continued)

*Primary Examiner* — Akm Zakaria

(57) ABSTRACT

A sensor apparatus adjusts output timings of a detection signal and a sensing signal for sensing an abnormality in the detection signal. Provided is a magnetic sensor apparatus comprising a magnetic sensor element, an amplifying section that amplifies and outputs an output of the magnetic sensor element, a plurality of comparing sections that compare the output of the magnetic sensor element or an output of the amplifying section to a threshold value, and a plurality of delaying sections that each delay and output a comparison result output by a corresponding comparing section among the plurality of comparing sections. Also provided is a current sensor apparatus including a current path through which a current serving as a measurement target flows and a magnetic sensor apparatus that is arranged corresponding to the current path and detects a magnetic field generated according to the current serving as the measurement target.

21 Claims, 16 Drawing Sheets

(56) References Cited

U.S. PATENT DOCUMENTS

| | | | |
|---|---|---|---|
| 5,694,038 | A | 12/1997 | Moody |
| 6,052,016 | A | 4/2000 | Sugiura |
| 9,778,326 | B2 * | 10/2017 | Chen .................. G01R 33/0029 |
| 2003/0020470 | A1 | 1/2003 | Hatanaka |
| 2007/0114988 | A1 | 5/2007 | Rossmann et al. |
| 2008/0265880 | A1 * | 10/2008 | Nishikawa ............ G01R 33/07 324/251 |
| 2010/0023289 | A1 * | 1/2010 | Miyazaki ............... G01R 29/02 702/69 |
| 2010/0085101 | A1 | 4/2010 | Walker |
| 2010/0308816 | A1 * | 12/2010 | Ueda ...................... G01R 33/07 324/260 |
| 2011/0199132 | A1 | 8/2011 | Motz et al. |
| 2012/0239350 | A1 | 9/2012 | Motz |
| 2013/0009678 | A1 | 1/2013 | Motz et al. |
| 2013/0076350 | A1 | 3/2013 | Muraoka et al. |
| 2014/0159756 | A1 * | 6/2014 | Ueno ................... G01R 15/202 324/750.01 |
| 2015/0185255 | A1 * | 7/2015 | Eaton ..................... G01R 33/60 324/316 |
| 2015/0185279 | A1 | 7/2015 | Milano et al. |

FOREIGN PATENT DOCUMENTS

| | | |
|---|---|---|
| JP | H05316785 A | 11/1993 |
| JP | H11-51697 A | 2/1999 |
| JP | 2003-114242 A | 4/2003 |
| JP | 2007-525680 A | 9/2007 |
| JP | 2009229302 A | 10/2009 |
| JP | 2010182464 A | 8/2010 |
| JP | 2011-226987 A | 11/2011 |
| JP | 2012182689 A | 9/2012 |
| JP | 2013-74415 A | 4/2013 |

OTHER PUBLICATIONS

Office Action issued for counterpart Japanese Application No. 2016-237315, drafted by the Japan Patent Office dated Nov. 19, 2018.

Office Action issued for counterpart Japanese Application No. 2016-237315, issued by the Japan Patent Office dated May 14, 2019 (drafted on Apr. 25, 2019).

* cited by examiner

MAGNETIC SENSOR APPARATUS AND CURRENT SENSOR APPARATUS

The contents of the following Japanese patent applications are incorporated herein by reference:
NO. 2015-252138 filed on Dec. 24, 2015,
NO. 2016-106367 filed on May 27, 2016, and
NO. 2016-237315 filed on Dec. 7, 2016.

BACKGROUND

1. Technical Field

The present invention relates to a magnetic sensor apparatus and a current sensor apparatus.

2. Related Art

A conventional processing system is known that performs various processes based on detection signals of sensor apparatuses such as a magnetic sensor and a current sensor, and this processing system receives an abnormality detection signal along with the detection signals from the sensor apparatuses and further performs processing based on the abnormality of the detection signal, as shown in Patent Documents 1 to 3, for example. Furthermore, a magnetic sensor is known that uses a Hall device, as shown in Non-Patent Document 1, for example.

Patent Document 1: US Patent Application Publication No. 2011/0199132
Patent Document 2: US Patent Application Publication No. 2013/0009678
Patent Document 3: US Patent Application Publication No. 2015/0185279
Non-Patent Document 1: R. S. Popovic et al., "Hall Effect Devices," Inst. of Physics Pub. Inc., May 1991

However, when there is variation in the receiving timings of the detection signals and the abnormality detection signals output from the sensor apparatuses, there are cases where the execution of a process based on the abnormality detection is delayed even though the processing system has detected the abnormality. For example, in a case where an abnormality such as overcurrent has been detected, the processing of the processing system should be stopped immediately, but when there is a delay in the processing after abnormality detection in this way, devices provided in the processing system, devices connected to the processing system, and the like malfunction or are damaged.

SUMMARY

Therefore, it is an object of an aspect of the innovations herein to provide a magnetic sensor apparatus and a current sensor apparatus, which are capable of overcoming the above drawbacks accompanying the related art. The above and other objects can be achieved by combinations described in the claims. According to a first aspect of the present invention, provided is a magnetic sensor apparatus comprising a magnetic sensor element; an amplifying section that amplifies and outputs an output of the magnetic sensor element; a plurality of comparing sections that compare the output of the magnetic sensor element or an output of the amplifying section to a threshold value; and a plurality of delaying sections that each delay and output a comparison result output by a corresponding comparing section among the plurality of comparing sections.

According to a second aspect of the present invention, provided is a current sensor apparatus comprising a current path through which a current serving as a measurement target flows; and the magnetic sensor apparatus according to the first aspect that is arranged corresponding to the current path and detects a magnetic field generated according to the current serving as the measurement target.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
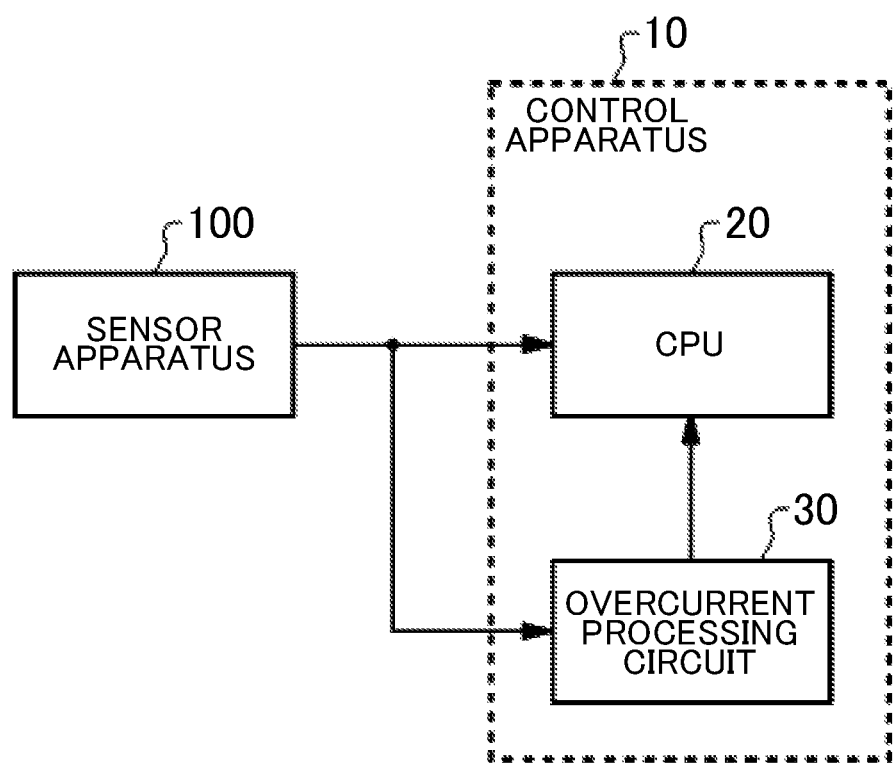
FIG. 1 shows an exemplary configuration of a control apparatus 10 that performs a predetermined process in response to a detection signal of a sensor apparatus 100.

FIG. 1 shows an exemplary configuration of a control apparatus 10 that performs a predetermined process in response to a detection signal of a sensor apparatus 100. The sensor apparatus 100 may be a magnetic sensor that detects an input magnetic field, or may instead be a current sensor that detects an input current. The sensor apparatus 100 outputs a detection signal corresponding to the magnitude of the magnetic field or the current input from the outside.

The control apparatus 10 controls an apparatus or the like connected to this control apparatus 10, according to the detection signal output by the sensor apparatus 100. The control target of the control apparatus 10 may be a motor, an actuator, a moving stage, an engine, and the like, as long as the apparatus is controlled according to the detection signal output by the sensor apparatus 100. The present embodiment describes an example in which the control apparatus 10 is connected to a motor and controls driving of the motor. In this case, the sensor apparatus 100 detects the drive current of this motor, and the control apparatus 10 performs feedback control corresponding to the detected drive current. Specifically, the control apparatus 10, the motor, and the sensor apparatus 100 form a processing system that drives the motor. The sensor apparatus 100 includes a CPU 20 and an overcurrent processing circuit 30.

The CPU 20 controls the driving of the motor according to the detection signal output by the sensor apparatus 100. For example, the CPU 20 is connected to the motor via an inverter circuit or the like and drives the motor by supplying a control signal for controlling the inverter circuit. The CPU 20 may control the driving of the motor based on a predetermined algorithm or the like. The CPU 20 may drive the motor by performing vector control, PID control, or the like.

The CPU 20 stops the control, suspends the control, or changes the control to protection control of the motor and the inverter circuit, in response to the detection of an abnormality in the detection signal by the overcurrent processing circuit 30. For example, the overcurrent processing circuit 30 may transmit an interrupt signal to perform these acts on the control to the CPU 20. Furthermore, the CPU 20 may include the overcurrent processing circuit 30, in which case the CPU 20 may directly receive the detection signal output by the sensor apparatus 100 as an interrupt signal. When the current for driving the motor has become an overcurrent that exceeds a reference value, there are cases where the motor heats up and causes poor operation, a malfunction, damage, or the like. When a short circuit has occurred in the drive circuit or the like, there are cases where poor operation, a malfunction, damage, or the like occurs in the circuit and/or the motor. Therefore, the overcurrent processing circuit 30 detects an abnormality in the detection signal based on the magnitude of the amplitude value of the detection signal or the like.

The overcurrent processing circuit 30 may determine that the drive current of the motor is an overcurrent in response to the detection signal being greater than or equal to a first reference value. Furthermore, the overcurrent processing circuit 30 may determine that a short circuit has occurred in response to the detection signal being less than or equal to a second reference value. The first reference value and the second reference value may be predetermined values, or may instead be values designated from the outside. FIG. 1 is used to describe an example in which the overcurrent processing circuit 30 detects an abnormality based on the detection signal, but instead the sensor apparatus 100 may detect an abnormality and the overcurrent processing circuit 30 may receive the detection result.

In the processing system described above, when an abnormality has been detected, it is preferable that the overcurrent processing circuit 30 immediately issues a control interrupt to the CPU 20 and the CPU 20 adjusts the control of the motor and the inverter circuit in a manner to stop the control, suspend the control, or change the control to protection control such that excessive current does not flow. However, there are cases where variations occur in the response time needed to respond to the detection signal received by the overcurrent processing circuit 30, due to the length of the signal lines, the parasitic resistance, the parasitic capacitance, and the like. In other words, variations occur in the respective reception timings at which the CPU 20 and the overcurrent processing circuit 30 receive the detection signal output from the sensor apparatus 100, such that even when the overcurrent processing circuit 30 detects an abnormality, there are cases where the CPU 20 cannot immediately perform the stopping of the control, the suspension of the control, or the change of the control to protection control of the motor and the inverter circuit.

As an example, in a case where the sensor apparatus 100 is formed as a single device, it is necessary to adjust the reception timing and the control timing of the CPU 20 and the overcurrent processing circuit 30 inside the control apparatus 10, and this increases the cost for designing, manufacturing, operational testing, abnormality detecting, upgrading, and the like. Therefore, the sensor apparatus according to the present embodiment outputs the detection signal and the sensing signal for sensing an abnormality in the detection signal inside the sensor apparatus with an adjustable output timing. Such a sensor apparatus is described below, first with an example of a magnetic sensor apparatus that detects a magnetic field.

Figure 2:
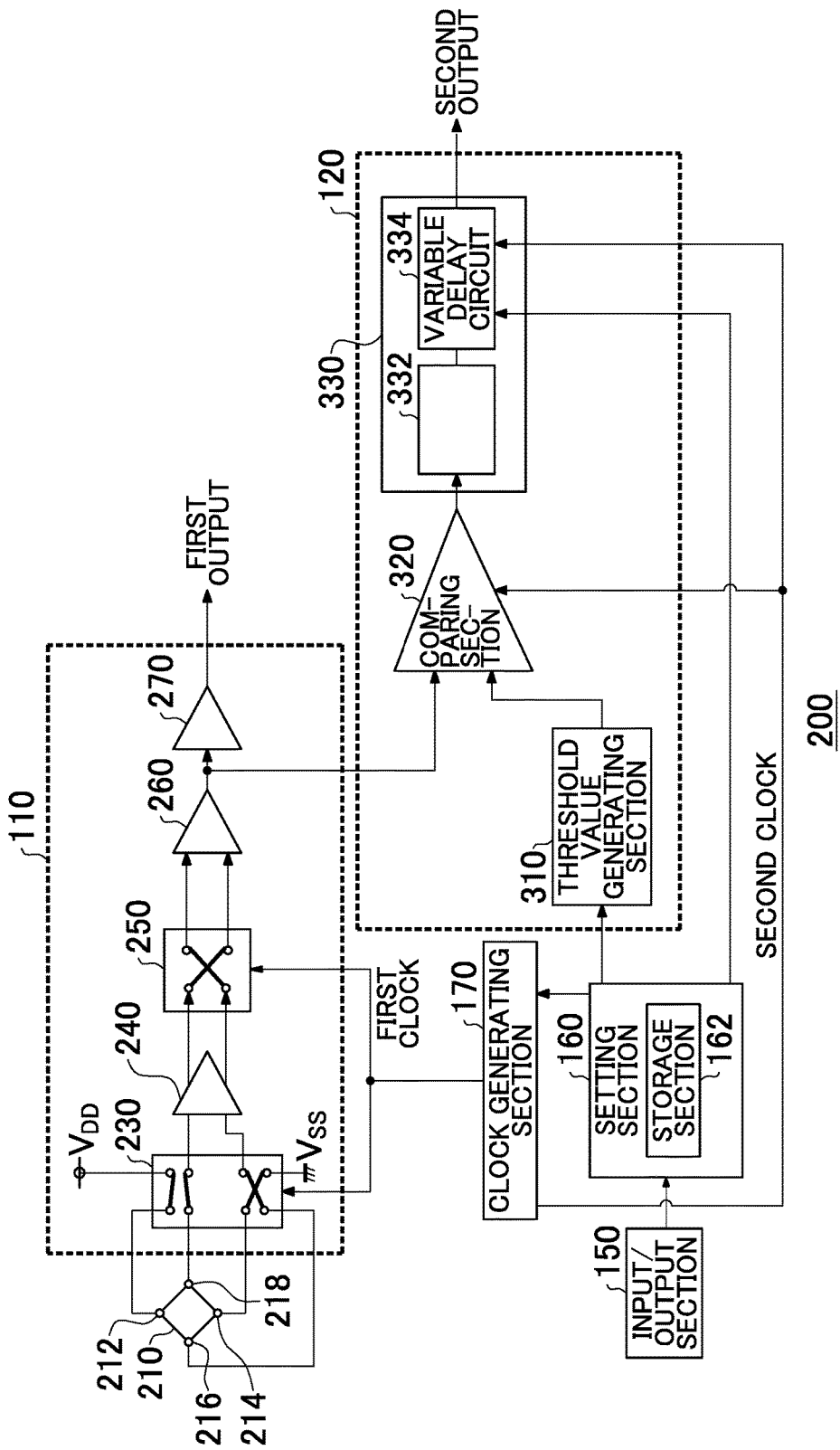
FIG. 2 shows an exemplary configuration of a magnetic sensor apparatus 200 according to the present embodiment.

FIG. 2 shows an exemplary configuration of a magnetic sensor apparatus 200 according to the present embodiment. The magnetic sensor apparatus 200 outputs, as a first output, a magnetic field detection signal corresponding to the magnitude of an input magnetic field. Furthermore, the magnetic sensor apparatus 200 outputs, as a second output, a sensing signal that provides notification of an abnormality when the input magnetic field is outside of a reference range. The magnetic sensor apparatus 200 includes a magnetic sensor element 210, an amplifying section 110, a detecting section 120, an input/output section 150, a setting section 160, and a clock generating section 170.

The magnetic sensor element 210 outputs a detection signal corresponding to the magnitude of the magnetic field input to the magnetic sensor apparatus 200. For example, the magnetic sensor element 210 is formed on a surface of a substrate or the like and detects the magnetic field in a direction substantially perpendicular to the plane of this surface. The magnetic sensor element 210 according to the present embodiment is an example that includes a Hall element. Here, with the substrate surface being the XY plane and the direction perpendicular to the XY plane being the Z axis, the Hall element is an element that creates electromotive force in the Y-axis direction corresponding to the magnetic field input in the Z-axis direction when current flows in the X-axis direction, i.e. an element exhibiting the Hall effect. The magnetic sensor element 210 may be formed with a cross shape in the XY plane. The magnetic sensor element 210 may be formed by a semiconductor or the like.

The magnetic sensor element 210 includes a first terminal pair having a terminal 212 and a terminal 214, and a second terminal pair having a terminal 216 and a terminal 218. The magnetic sensor element 210 includes a substrate having the first terminal pair and the second terminal pair formed on the surface thereof, and the magnetic sensor element 210 detects the magnetic field input substantially perpendicular to the substrate, for example. In other words, when current flows through the first terminal pair, the magnetic sensor element 210 generates electromotive force corresponding to the magnetic field from the second terminal pair according to the input magnetic field. Furthermore, when current flows through the second terminal pair, the magnetic sensor element 210 generates electromotive force corresponding to the magnetic field from the first terminal pair according to the input magnetic field.

There are cases where such a magnetic sensor element 210 outputs an output signal that includes an offset signal unique to the element. In order to reduce such an offset signal, the spinning current technique described in Non-Patent Document 1 or the like may be used. The spinning current technique includes switching the direction of the current flowing through the Hall element and inverting the polarities of the signal component caused by the offset and the signal component corresponding to the input magnetic field, based on a spinning current clock that repeats a first phase and a second phase.

For example, during the first phase, the magnetic sensor element 210 that conducts from the terminal 212 to the terminal 214 (set as the +X direction) in response to the input magnetic field B in the +Z direction generates a Hall electromotive force signal $+V_S$ from the terminal 218 (set as the +Y-direction side), i.e. generates a Hall electromotive force signal $-V_S$ from the terminal 216 on the −Y-direction side, and also outputs an offset voltage $+V_O$ in the +Y direction. In this case, in the second phase, when the magnetic sensor element 210 conducts from the terminal 218 to the terminal 216 (the −Y direction) in response to the same input magnetic field in the +Z direction, the magnetic sensor element 210 generates a Hall electromotive force signal $+V_S$ from the terminal 214 on the +X-direction side, i.e. generates a Hall electromotive force signal $-V_S$ from the terminal 212 on the −X-direction side, and also outputs an offset voltage $+V_O$ in the +X direction.

Accordingly, by acquiring an output voltage $V_{h1}$ from the second terminal pair in the Y-axis direction of the magnetic sensor element 210 during the first phase and acquiring an output voltage $V_{h2}$ from the first terminal pair in the X-axis direction of the magnetic sensor element 210 during the second phase, the detection signal of the magnetic field B of the magnetic sensor element 210 is expressed as shown in the following expression. This expression shows an example in which the terminal 218 and the terminal 212 are given positive signs.

$$V_{h1}=2V_S+V_O$$

$$V_{h2}=-2V_S+V_O \qquad \text{Expression 1:}$$

In this way, by switching the conduction direction, as shown in Expression 1, it is possible to invert the sign of the signal component of the Hall electromotive force signal $V_S$ in the detection signal of the Hall element between the first phase and the second phase. In other words, the spinning current technique includes modulating the Hall electromotive force signal with the spinning current clock to obtain a modulated signal and outputting the offset voltage $V_O$ as DC signal output, and therefore it is possible to separate this signal into two signals in the frequency domain and, ideally, to remove the offset signal using a filter or the like.

The amplifying section 110 receives the modulated detection signal of the magnetic sensor element 210 while switching the drive current of the magnetic sensor element 210 being supplied in this manner, demodulates this detection signal, and outputs the resulting signal as the first output. Furthermore, the amplifying section 110 includes an amplification circuit therein, to amplify and output the output of the magnetic sensor element 210. The amplifying section 110 includes a switching section 230, a first amplification circuit 240, a demodulating section 250, a second amplification circuit 260, and a third amplification circuit 270.

The switching section 230 switches the terminal pair causing the drive current to flow and the terminal pair that senses the output of the magnetic sensor element 210, between the first terminal pair and the second terminal pair of the magnetic sensor element 210, according to a first clock supplied from the outside. For example, during a first phase of the first clock, the switching section 230 connects the power supply potential $V_{DD}$ to the terminal 212 and connects the reference potential $V_{SS}$ to the terminal 214, to supply the drive current to the first terminal pair. In this case, during a second phase of the first clock, the switching section 230 connects the power supply to the terminal 218 and connects the reference potential $V_{SS}$ to the terminal 216, to supply the drive current to the second terminal pair. The reference potential $V_{SS}$ is 0 V, for example.

Furthermore, as an example, during the first phase of the first clock, the switching section 230 sets the terminal 216 and the terminal 218 to be detection terminals and connects these detection terminals to the first amplification circuit 240 located downstream. In this case, during the second phase of the first clock, the switching section 230 sets the terminal 212 and the terminal 214 to be detection terminals and connects these detection terminals to the first amplification circuit 240 located downstream. The switching section 230 may set the terminal 218 and the terminal 212 to be positive detection terminals.

The first amplification circuit 240 amplifies the output signal of the magnetic sensor element 210 supplied from the switching section 230. The first amplification circuit 240 may be a differential amplification circuit. Alternatively, the first amplification circuit 240 may be a differential transistor pair that converts voltage into current. The first amplification circuit 240 amplifies the output voltage $V_{h1}$ from the second terminal pair shown in Expression 1 during the first phase of the first clock, and amplifies the output voltage $V_{h2}$ from the first terminal pair during the second phase of the first clock. The first amplification circuit 240 supplies the amplified signal to the demodulating section 250.

The demodulating section 250 inverts the positive/negative sign of the signal input thereto, at a predetermined timing. The demodulating section 250 may invert the positive/negative sign of the signal at a timing synchronized with the switching timing of the switching section 230. In other words, the demodulating section 250 may invert the positive/negative sign of the signal according to the first clock supplied from the outside.

The demodulating section 250 receives the input signal as a differential signal using two signal lines from the first amplification circuit 240, and outputs the received signal as a differential signal using two signal lines. In this case, the demodulating section 250 may switch between (i) connecting one of the input signal lines to one of the output signal lines and connecting the other input signal line to the other output signal line and (ii) connecting the one input signal line to the other output signal line and connecting the other input signal line to the one output signal line.

In this way, the output signal $V_{o1}$ during the first phase and the output signal $V_{o2}$ during the second phase of the demodulating section 250 are expressed as shown in the following expression. In this expression, A indicates the amplification rate of the first amplification circuit 240.

$$V_{o1}=+A(2V_S+V_O)$$

$$V_{o1}=+A(2V_S-V_O) \qquad \text{Expression 2:}$$

By inverting the input signal in synchronization with the first clock, the demodulating section 250 makes the Hall electromotive force signal $V_S$ a direct current component and makes the offset voltage $V_O$ a modulated signal component. The demodulating section 250 supplies the second amplification circuit 260 with the output signal such as shown in Expression 2.

The second amplification circuit 260 amplifies the output signal supplied from the demodulating section 250. The second amplification circuit 260 may be a differential amplification circuit. Alternatively, the second amplification circuit 260 may be a current-voltage conversion circuit. The second amplification circuit 260 supplies the third amplification circuit 270 with the amplified signal. Furthermore, the second amplification circuit 260 supplies the detecting section 120 with the amplified signal.

The third amplification circuit 270 amplifies the output signal supplied from the second amplification circuit 260. The third amplification circuit 270 may be a buffer amplifier. Alternatively, the third amplification circuit 270 may be a differential amplification circuit. The third amplification circuit 270 may output an analog signal. The third amplification circuit 270 may supply the amplified signal to the outside, as the first output of the amplifying section 110. If the output signal of the second amplification circuit 260 can be output as the first output of the amplifying section 110, the third amplification circuit 270 does not need to be included.

The amplifying section 110 according to the present embodiment described above outputs, as the first output, the magnetic field detection signal of the magnetic sensor element 210 having a Hall electromotive force signal $V_S$ that is a direct current component and an offset voltage $V_O$ that is a modulated signal component. The amplifying section 110 may further include a filter or the like, and may output a magnetic field detection signal in which the offset voltage $V_O$ has been reduced. Here, the delay amount from when the amplifying section 110 receives the output of the magnetic sensor element 210 to when the amplifying section 110 outputs the first output is a first delay amount. The first delay amount is 5 µs, for example.

The detecting section 120 detects an abnormality by comparing the amplified signal received from the amplifying section 110 to a threshold value. The detecting section 120 outputs the detection results as a second signal. Here, the detecting section 120 is able to change the delay time of the second signal. The detecting section 120 includes a threshold value generating section 310, a comparing section 320, and a delaying section 330.

The threshold value generating section 310 generates the threshold value for the signal input to the detecting section 120 from the amplifying section 110. The threshold value generating section 310 may generate the threshold value corresponding to a designation from the outside. The threshold value generating section 310 may generate the threshold value corresponding to an upper limit value and a lower limit value of the output of the magnetic sensor element 210. The threshold value generating section 310 supplies the comparing section 320 with the generated threshold value.

The comparing section 320 compares the output of the magnetic sensor element 210 or the output of the amplifying section 110 to the threshold value generated by the threshold value generating section 310. For example, the comparing section 320 outputs a comparison result indicating whether the output of the amplifying section 110 exceeds the upper limit and whether the output of the amplifying section 110 is below the lower limit. By using such a comparison result, it is possible to detect abnormal output of the magnetic sensor element 210 in response to a case where the output of the amplifying section 110 exceeds the upper limit or a case where the output of the amplifying section 110 is below the lower limit. Furthermore, it is possible to detect that the output of the magnetic sensor element 210 is normal in a case where the output of the amplifying section 110 is in a range between the upper limit and the lower limit. The comparing section 320 may compare the output of the magnetic sensor element 210 to the threshold value according to a second clock that at least has a different phase than the first clock. The comparing section 320 supplies the delaying section 330 with this comparison result.

The delaying section 330 delays and outputs the comparison result output by the comparing section 320. The delaying section 330 includes a glitch filter 332 and a variable delay circuit 334. The glitch filter 332 removes glitches in the comparison result output by the comparing section 320. The glitch filter 332 reduces the incorrect judgments of the comparing section 320 caused by transient noise or the like. The glitch filter 332 may be formed by a low-pass filter, a sample/hold circuit, a flip-flop, and/or the like. The glitch filter 332 may operate according to the second clock, and may remove the glitches by counting the number of glitches (counting the comparison results output by the comparing section 320 that are outside the range defined by the upper limit and the lower limit) according to the second clock and judging determining whether each is a glitch.

The variable delay circuit 334 delays and outputs the comparison result passed through the glitch filter 332. The variable delay circuit 334 may delay the comparison result according to the second clock. The variable delay circuit 334 delays and outputs the comparison result using a delay amount that is set from the outside. The variable delay circuit 334 may be able to adjust the delay amount of the detecting section 120 within a range that is approximately equal to or greater than the first delay amount. For example, in a case where the delay amount from when the input is made to the detecting section 120 to when this input reaches the variable delay circuit 334 is 1 µs, the variable delay circuit 334 can vary the delay amount in a range from 0 µs to 5 µs. The variable delay circuit 334 may be formed by a shift register, a counter, a flip-flop, a combination of a plurality of delay lines and switches, and/or the like. By forming the glitch filter 332 and the variable delay circuit 334 in this way, the delaying section 330 can make fine adjustments to the delay time while removing unnecessary glitches.

The input/output section 150 transfers signals to and from the outside of the magnetic sensor apparatus 200. For example, the input/output section 150 receives a signal for setting parameters or the like of internal circuits of the magnetic sensor apparatus 200. Furthermore, the input/output section 150 may supply information such as the parameters of the internal circuits to the outside, in response to a request or the like from the outside. Yet further, the input/output section 150 may supply the operational states or the like of the internal circuits to the outside. The input/output section 150 is connected to the external control apparatus 10 and performs internal settings and/or operation control of the magnetic sensor apparatus 200 according to the control apparatus 10, for example.

The setting section 160 sets the parameters or the like of the internal circuits of the magnetic sensor apparatus 200. The setting section 160 may set the parameters or the like of the internal circuits according to instructions from the outside that are received by the input/output section 150. The setting section 160 may include a storage section 162, and store the parameters or the like of the internal circuits.

Furthermore, the setting section 160 may store the parameters or the like of the internal circuits according to a signal from the outside. The setting section 160 may store the parameters or the like of the internal circuits based on data stored in the storage section 162.

The setting section 160 sets the delay amount of the variable delay circuit 334 according to instructions from the outside. Furthermore, the setting section 160 may set the threshold value of the threshold value generating section 310 according to instructions from the outside. The setting section 160 may set the clock frequency of the clock generating section 170 according to instructions from the outside. The setting section 160 may set the number for judging glitches by the glitch filter 332 or the time until removal, according to instructions from the outside.

The clock generating section 170 generates the first clock. Furthermore, the clock generating section 170 generates the second clock, which has a period that is an integer multiple of the period of the first clock and a predetermined phase difference relative to the timing of the first clock. Specifically, the second clock has a frequency that is a multiple of an integer greater than or equal to one of the first clock. The clock generating section 170 may generate the first clock and the second clock in a manner to have variable frequencies, and in this case these frequencies may be set by the setting section 160. The clock generating section 170 supplies the amplifying section 110 with the generated first clock and supplies the detecting section 120 with the generated second clock.

The magnetic sensor apparatus 200 according to the present embodiment described above uses the spinning current technique to separate the magnetic detection component and the offset component of the magnetic sensor element 210 according to frequency and output these components as the first output, while outputting the detection signal detecting an abnormality in the magnetic detection component as the second output. Furthermore, the magnetic sensor apparatus 200 can programmably adjust the delay amount of the second output from the outside via the input/output section 150.

Here, the magnetic sensor apparatus 200 may set the delay amount of the second output to be smaller than the first delay amount of the first output. In this way, the control apparatus 10 or the like connected to the magnetic sensor apparatus 200 can receive the second output before receiving the first output, and in response to the second output being a signal indicating the detection of an abnormality, the CPU 20 can immediately cut off the output of inverter circuit. In this way, protection of the motor, the inverter circuit, and the like can be performed easily. In this case, since the control apparatus 10 or the like can change the delay amount of the second output of the magnetic sensor apparatus 200, it is possible to reduce the number of steps such as adjusting the timing of the internal circuits of the control apparatus 10, and to reduce the manufacturing cost. The following describes the comparing section 320 of such a magnetic sensor apparatus 200.

Figure 3:
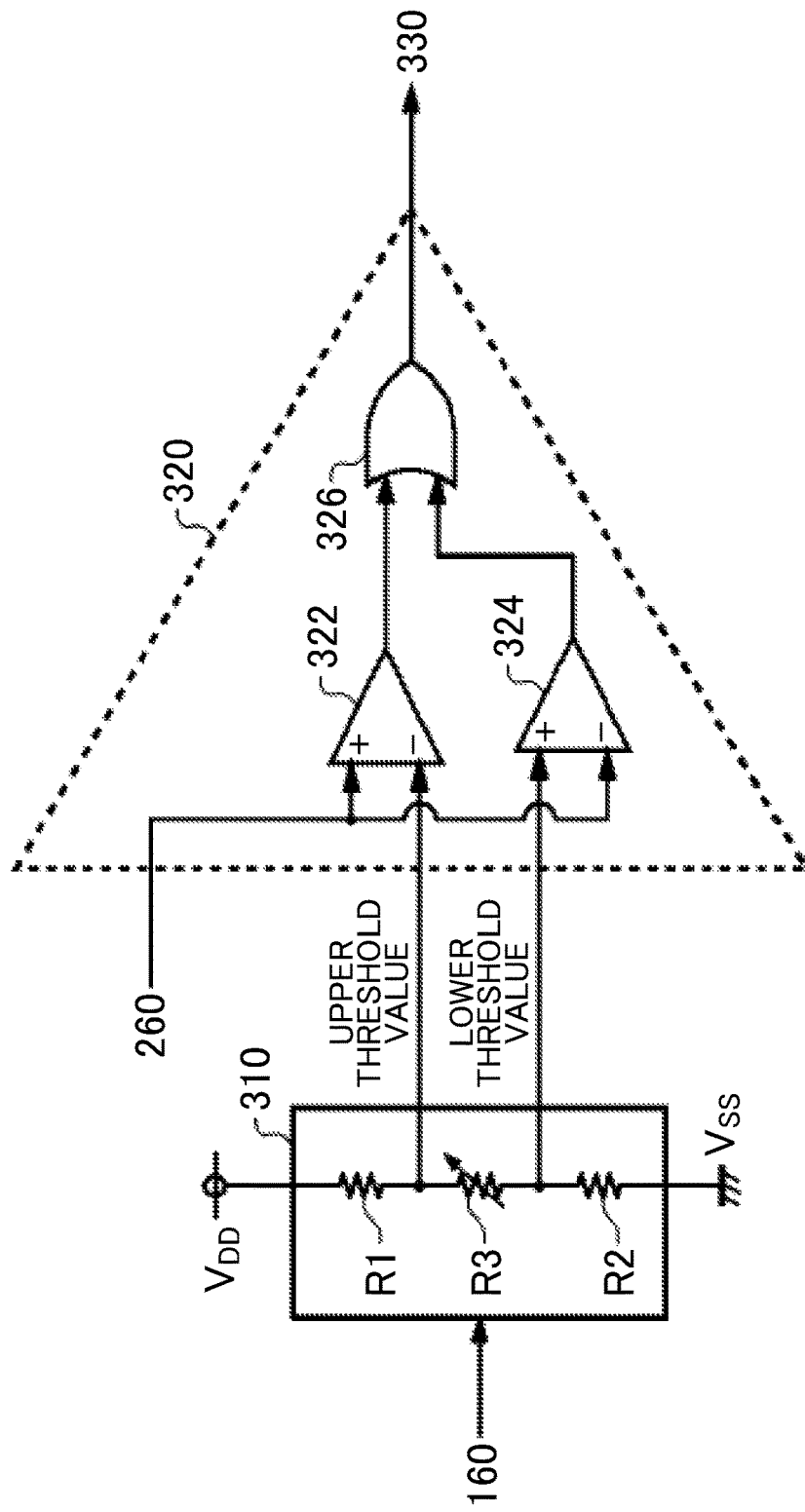
FIG. 3 shows an exemplary configuration of the threshold value generating section 310 and the comparing section 320 according to the present embodiment.

FIG. 3 shows an exemplary configuration of the threshold value generating section 310 and the comparing section 320 according to the present embodiment. In FIG. 3, components having substantially the same operation as in the magnetic sensor apparatus 200 according to the present embodiment shown in FIG. 2 are given the same reference numerals and descriptions thereof are omitted.

The threshold value generating section 310 generates an upper threshold value corresponding to the upper limit value and a lower threshold value corresponding to the lower limit value of the output of the magnetic sensor element 210. FIG. 3 shows an example in which the threshold value generating section 310 generates two threshold values using three resistors. The threshold value generating section 310 includes three resistors connected in series between the power supply voltage $V_{DD}$ and the reference potential $V_{SS}$. As an example, the resistor R1 has one end connected to the power supply voltage $V_{DD}$, the resistor R2 has one end connected to the reference potential $V_{SS}$, and the resistor R3 is connected between the resistor R1 and the resistor R2. The resistor R1 and the resistor R3 may have fixed resistances. The resistor R2 has a variable resistance, and this resistance value may be capable of being set by the setting section 160.

FIG. 3 shows an example in which the upper threshold value is set as the potential between the resistor R1 and the resistor R3 and the lower threshold value is set as the potential between the resistor R3 and the resistor R2. In other words, by having the setting section 160 set the resistance value of the resistor R3, the threshold value generating section 310 can generate the corresponding upper threshold value and lower threshold value. The threshold value generating section 310 shown in FIG. 3 is just one example, and the threshold value generating section 310 is not limited to this example. For example, at least two resistors among the resistor R1, the resistor R2, and the resistor R3 may have a variable resistance, and in this case the setting section 160 sets the resistance values of the at least two variable resistances. In this way, the setting section 160 can independently set each of the upper threshold value and the lower threshold value.

The comparing section 320 includes a first comparing circuit 322, a second comparing circuit 324, and a logic circuit 326. The first comparing circuit 322 compares the output signal from the second amplification circuit 260 and the upper threshold value. For example, the first comparing circuit 322 outputs a high potential when this output signal is greater than the upper threshold value, and outputs a low potential when this output signal is less than or equal to the upper threshold value. In other words, the first comparing circuit 322 judges whether the output of the magnetic sensor element 210 exceeds the set upper limit value.

The second comparing circuit 324 compares the output signal from the second amplification circuit 260 and the lower threshold value. For example, the second comparing circuit 324 outputs a high potential when this output signal is less than the lower threshold value, and outputs a low potential when this output signal is greater than or equal to the lower threshold value. In other words, the second comparing circuit 324 judges whether the output of the magnetic sensor element 210 is below the set lower limit value. The first comparing circuit 322 and the second comparing circuit 324 may be comparators.

The logic circuit 326 outputs the logical sum of the output of the first comparing circuit 322 and the output of the second comparing circuit 324. In other words, the logic circuit 326 outputs a high potential in response to the output of the magnetic sensor element 210 exceeding the upper limit value or being below the lower limit value. Furthermore, the logic circuit 326 outputs a low potential when the output of the magnetic sensor element 210 is in a range between the upper limit value and the lower limit value. The following describes the operation of the threshold value generating section 310 and the comparing section 320 described above.

Figure 4:
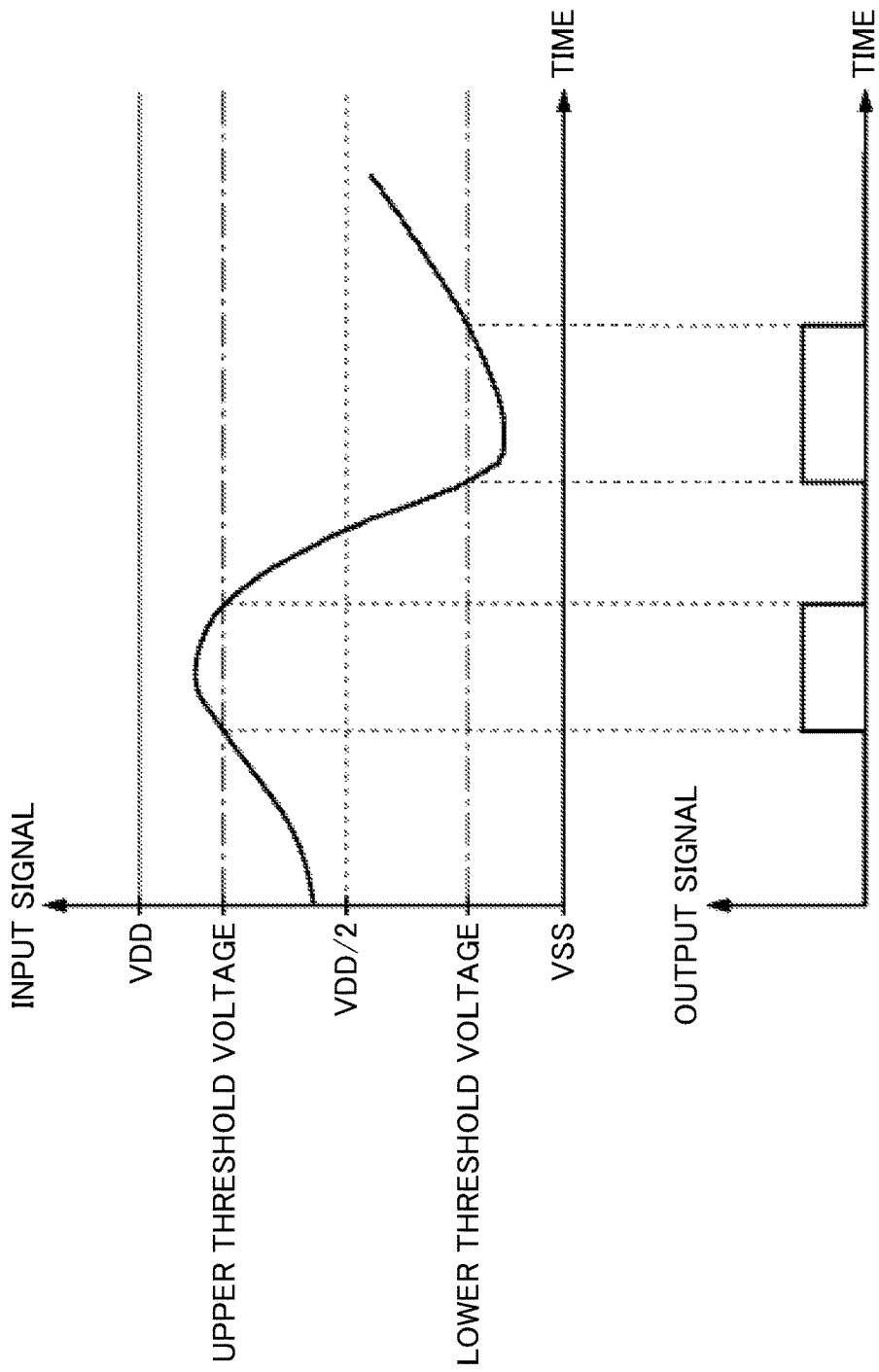
FIG. 4 shows a first example of an input signal and an output signal of the comparing section 320 according to the present embodiment.

FIG. 4 shows a first example of an input signal and an output signal of the comparing section 320 according to the present embodiment. In FIG. 4, the horizontal axis indicates time and the vertical axis indicates the signal voltage. FIG. 4 shows an example in which the reference potential $V_{SS}$ is 0 V, the upper threshold voltage is greater than $V_{DD}/2$ and less than $V_{DD}$, and the lower threshold voltage is greater than $V_{SS}$ and less than $V_{DD}/2$. The comparing section 320 outputs the output signal with a high potential or a low potential according to the input signal.

For example, the comparing section 320 outputs a high potential in response to the input signal exceeding the upper threshold voltage, and also outputs a high potential in response to the input signal being less than the lower threshold voltage. Furthermore, the comparing section 320 outputs a low potential when the input signal is both greater than or equal to the lower threshold voltage and less than or equal to the upper threshold voltage. In the manner described above, the comparing section 320 can detect an abnormality in the output of the magnetic sensor element 210 by comparing the input signal to the threshold values. Furthermore, even when noise is mixed in with the input signal such as shown in FIG. 4, thereby causing the input signal to temporarily exceed or fall below a threshold voltage, since the glitch filter 332 reduces this noise, the detecting section 120 can prevent mistaken detection of abnormal output of the magnetic sensor element 210.

Figure 5:
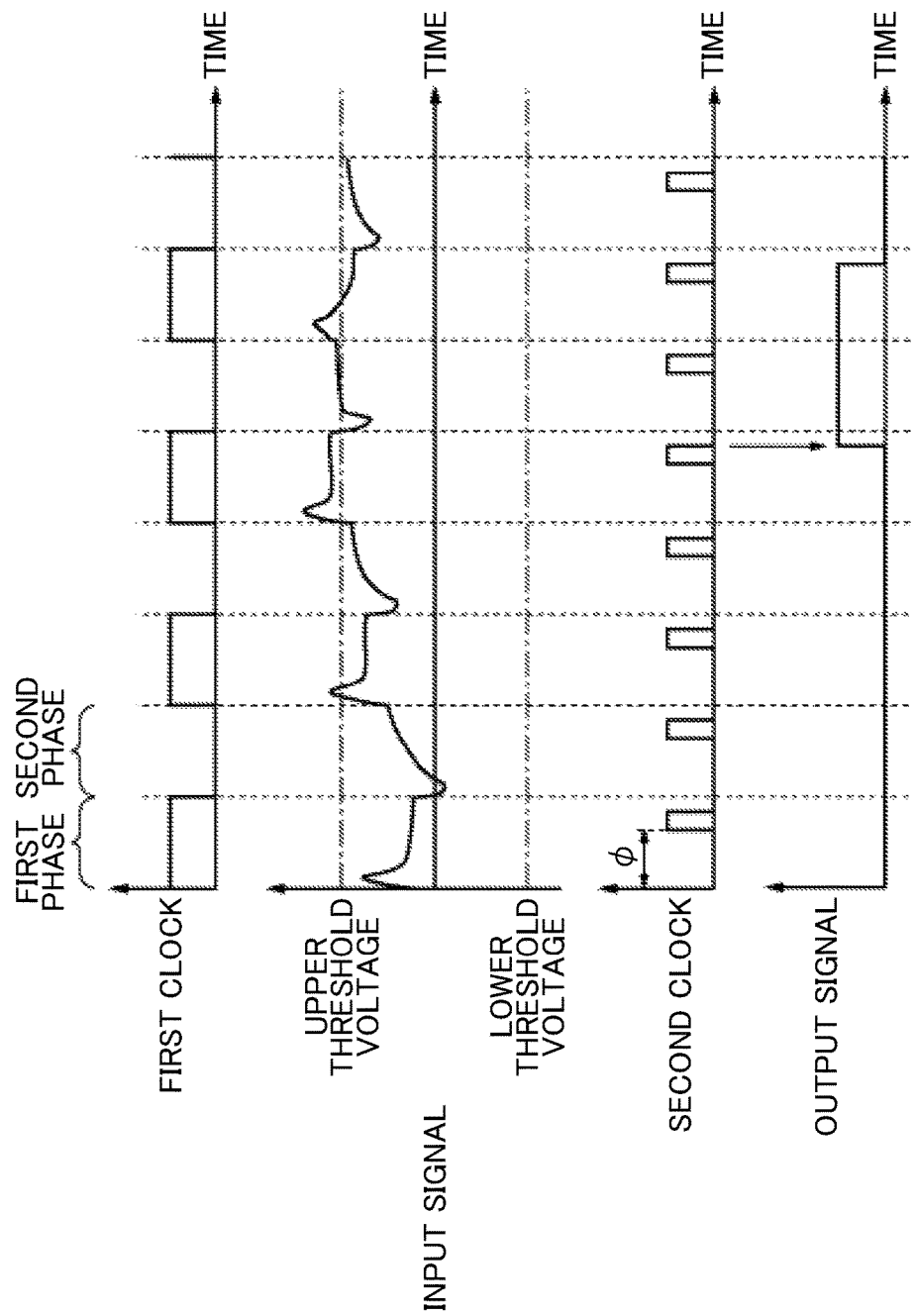
FIG. 5 shows a second example of an input signal and an output signal of the comparing section 320 according to the present embodiment.

FIG. 5 shows a second example of an input signal and an output signal of the comparing section 320 according to the present embodiment. In FIG. 5, the horizontal axis indicates time and the vertical axis indicates the signal voltage. FIG. 5 shows an example of an input signal and an output signal of the comparing section 320 in a case where the magnetic sensor apparatus 200 performs the spinning current technique. In other words, using the first clock generated by the clock generating section 170 as the spinning current clock, the switching section 230 modulates the Hall electromotive force signal by switching the terminals that cause the drive current to flow and the terminals that sense the output of the magnetic sensor element 210. The demodulating section 250 then demodulates the modulated Hall electromotive force signal, according to the first clock.

When a constant electric field is input to the magnetic sensor element 210, the input signal of the comparing section 320 ideally becomes a Hall electromotive force signal with a constant voltage. However, when the switching section 230 performs the switching operation, there are cases where transient noise occurs as a spike due to the floating capacitance elements and the like included in the magnetic sensor element 210. Furthermore, there are cases where transient noise occurs as a spike during the switching operation of the demodulating section 250 as well. Therefore, the comparing section 320 performs the comparison operation using the second clock, which has a different timing than the rising and falling timing of the first clock.

In this way, the comparing section 320 can compare the input signal and the threshold values during a time period when the spike noise occurring at the rising timing and falling timing of the first clock is reduced, and can therefore more accurately perform the comparison operation. Furthermore, by using the second clock with a frequency that is at least double the frequency of the first clock, the comparing section 320 can increase the time resolution.

FIG. 5 shows an example in which positive spike noise occurs in the input signal at the rising timing of the first phase of the first clock and negative spike noise occurs in the input signal at the falling timing of the second phase of the first clock. Furthermore, FIG. 5 shows an example in which the comparing section 320 compares the input signal to the threshold values according to a second clock that has double the frequency of the first clock and a phase difference of $\Delta\varphi$ relative to the rising timing and the falling timing of the first clock.

The comparing section 320 uses the result obtained by comparing the input signal to the threshold values according to the second clock as the output signal. FIG. 5 shows an example in which the comparing section 320 sets the output signal to a high potential in response to the input signal exceeding the upper threshold value at the falling timing of the second clock. Furthermore, FIG. 5 shows an example in which the comparing section 320 sets the output signal to a low potential in response to the input signal being less than or equal to the upper threshold value at the falling timing of the second clock.

In this way, even when an input signal having spike noise at the timing of the first clock is input, by using the second clock that has a different phase than the first clock, the detecting section 120 can prevent mistaken detection of abnormal output of the magnetic sensor element 210. Accordingly, the magnetic sensor apparatus 200 can separate the DC noise component and the signal component of the magnetic sensor element 210 according to the frequency by performing the spinning current technique, and can accurately detect abnormal output of the magnetic sensor element 210. The magnetic sensor apparatus 200 then programmably delays the comparison result of the comparing section 320, which is the detection result, and can therefore perform output in a manner to enable setting of the timing of the output of the magnetic sensor element 210 that has been separated from the noise and the timing of the output of the accurate detection result, according to instructions from the outside.

The magnetic sensor apparatus 200 according to the present embodiment described above is an example in which there is one set of the comparing section 320 and the delaying section 330, but the magnetic sensor apparatus 200 is not limited to this. The magnetic sensor apparatus 200 may include a plurality of comparing sections 320 and delaying sections 330. In such a case, the magnetic sensor apparatus 200 includes a plurality of comparing sections 320 that each compare the output of the magnetic sensor element 210 or the output of the amplifying section 110 to the threshold values and a plurality of delaying sections 330 that each delay and output the comparison result output by the corresponding comparing section 320 among the plurality of comparing sections 320. The following describes an example of such a magnetic sensor apparatus 200.

Figure 6:
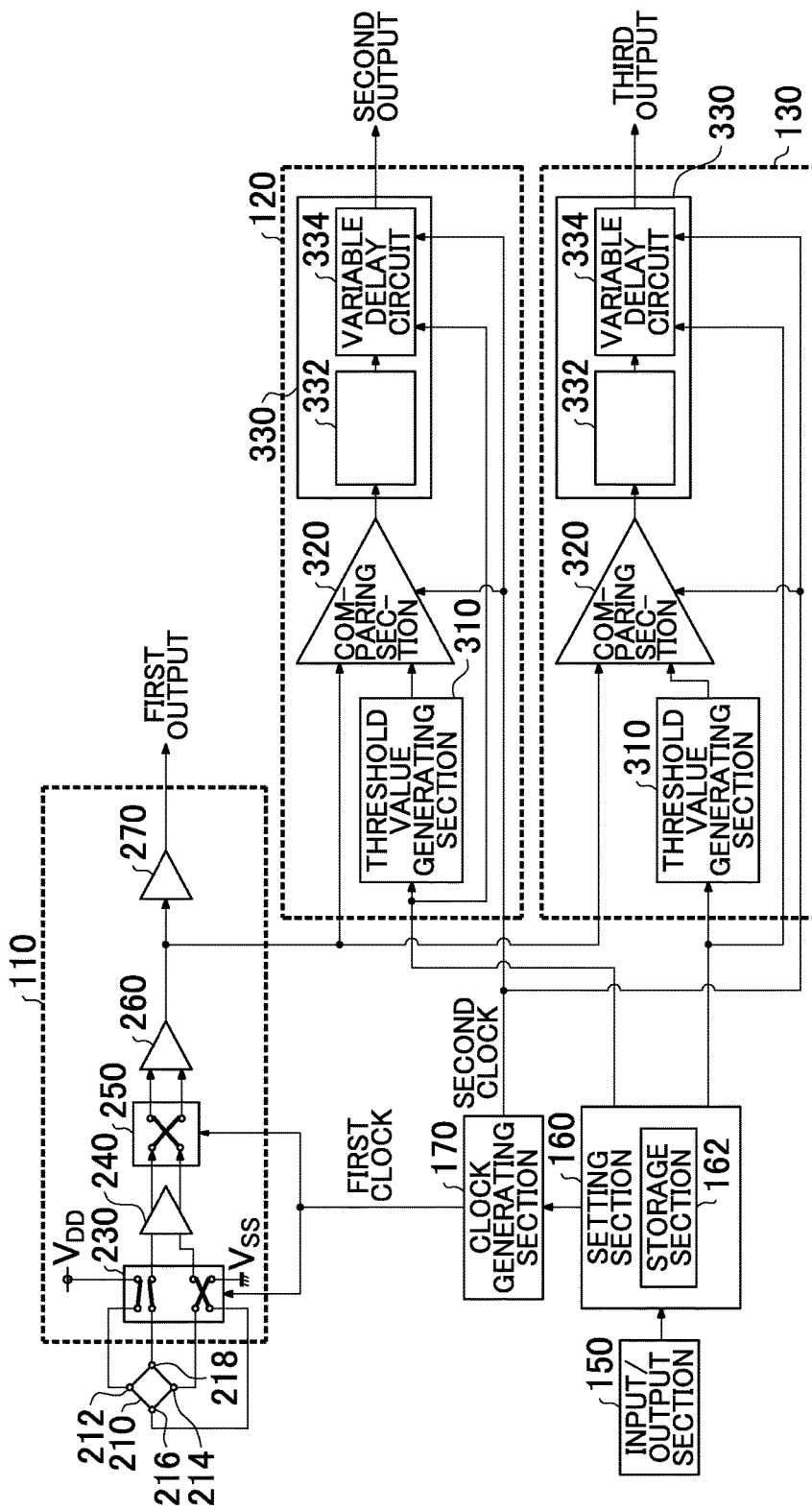
FIG. 6 shows a first modification of the magnetic sensor apparatus 200 according to the present embodiment.

FIG. 6 shows a first modification of the magnetic sensor apparatus 200 according to the present embodiment. In the magnetic sensor apparatus 200 of the first modification, components having substantially the same operation as components in the magnetic sensor apparatus 200 according to the present embodiment shown in FIG. 2 are given the same reference numerals and descriptions thereof are omitted. The magnetic sensor apparatus 200 of the first modification includes a plurality of comparing sections 320 and a plurality of delaying sections 330.

Here, the plurality of delaying sections 330 each include a variable delay circuit 334. The setting section 160 sets the delay amount of each variable delay circuit 334 according to instructions from the outside. The plurality of delaying sections 330 may further include a plurality of glitch filters 332 that each remove glitches in the comparison result output by a corresponding comparing section 320 among the plurality of comparing sections 320. In this case, each variable delay circuit 334 delays and outputs the comparison result that has passed through the corresponding glitch filter 332 among the plurality of glitch filters 332.

Each comparing section 320 among the plurality of comparing sections 320 compares the output of the magnetic sensor element 210 or the output of the amplifying section 110 to the threshold values according to the second clock. Furthermore, each delaying section 330 among the plurality of delaying sections 330 delays the comparison result output by the corresponding comparing section 320, according to the second clock. In other words, the magnetic sensor apparatus 200 of the first modification includes a plurality of detecting sections 120. FIG. 6 shows an example in which the magnetic sensor apparatus 200 includes a detecting section 120 that outputs the second output and a detecting section 130 that outputs a third output.

The setting section 160 may be capable of setting different values for the threshold value set for the threshold value generating section 310 of the detecting section 120 and the threshold value set for the threshold value generating section 310 of the detecting section 130. For example, among the plurality of sets of a comparing section 320 and a delaying section 330, the comparing section 320 of a first set compares the output of the magnetic sensor element 210 or the output of the amplifying section 110 to a first threshold value. Furthermore, among the plurality of sets of a comparing section 320 and a delaying section 330, the comparing section 320 of a second set compares the output of the magnetic sensor element 210 or the output of the amplifying section 110 to a second threshold value differing from the first threshold value. In FIG. 6, the detecting section 120 is an example of the first set of a comparing section 320 and a delaying section 330, and the detecting section 130 is an example of a second set of a comparing section 320 and a delaying section 330.

The setting section 160 sets the first threshold value for the comparing section 320 of the detecting section 120, and sets the second threshold value for the comparing section 320 of the detecting section 130. Here, the first threshold value may have a first upper threshold value and a first lower threshold value indicating a predetermined first output range of the magnetic sensor element 210, and the second threshold value may have a second upper threshold value that is smaller than the first upper threshold value and a second lower threshold value that is larger than the first lower threshold value indicating a predetermined second output range of the magnetic sensor element 210.

In this way, the control apparatus 10 or the like connected to the magnetic sensor apparatus 200 of the first modification can be used to make the second output of the detecting section 120 and the third output of the detecting section 130 different. For example, the control apparatus 10 sets the threshold value of the detecting section 120 to be approximately the rated output voltage of the first output or approximately a range of the rated output of the first output, and in response to the second output being a high potential, the CPU 20 cuts off the output of the inverter circuit. For example, when the rated output voltage of the first output is 4.5 V on the high voltage side and 0.5 V on the low voltage side, the threshold value of the detecting section 120 may be 4.4 V on the high voltage side and 0.6 V on the low voltage side.

As another example, in a case where the control apparatus 10 includes a feedback circuit or the like to control the magnitude of the magnetic field input to the magnetic sensor element 210, the range of the threshold values of the detecting section 130 may be set to be smaller than the range of the threshold values of the detecting section 120. Specifically, the upper threshold voltage of the detecting section 130 is set to be less than the upper threshold voltage of the detecting section 120. Furthermore, the lower threshold voltage of the detecting section 130 is set to be larger than the lower threshold voltage of the detecting section 120. In this case, the control apparatus 10 may cause the feedback circuit to operate such that the output of the magnetic sensor element 210 is within a normal operating range, in response to the third output becoming a high potential. In this way, while controlling the input magnetic field according to the output of the magnetic sensor element 210 using the third output, when the range of the output signal of the magnetic sensor element 210 indicates a severe abnormality, the control apparatus 10 can stop the operation using the second output.

Here, the setting section 160 may be capable of setting different values for the delay time of the detecting section 120 and the delay time of the detecting section 130. Specifically, the delaying section 330 of the first set and the delaying section 330 of the second set may have different delay amounts. In this case, the delaying section 330 of the first set may have a smaller delay amount than the delaying section 330 of the second set. Instead, the delaying section 330 of the first set may have a larger delay amount than the delaying section 330 of the second set.

As an example, the control apparatus 10 sets the delay time of the delaying section 330 of the detecting section 120 to be shorter than the delay time of the delaying section 330 of the detecting section 130. In this way, the control apparatus 10 can receive an indication of whether the output of the magnetic sensor element 210 is in a range indicating a severe abnormality from the second output earlier than the third output, and can immediately stop the operation. As another example, the control apparatus 10 may set the delay time of the detecting section 120 to be longer than the delay time of the detecting section 130. In this way, even when the output of the magnetic sensor element 210 changes suddenly and the comparing sections 320 of the detecting section 120 and the detecting section 130 output a high potential at the same time, the control apparatus 10 can guarantee enough time to perform the protection control due to the third output before beginning the protection control due to the second output. In other words, by setting different values for the delay times of the detecting section 120 and the detecting section 130 in this way, fine control of the control apparatus 10 can be realized.

Figure 7:
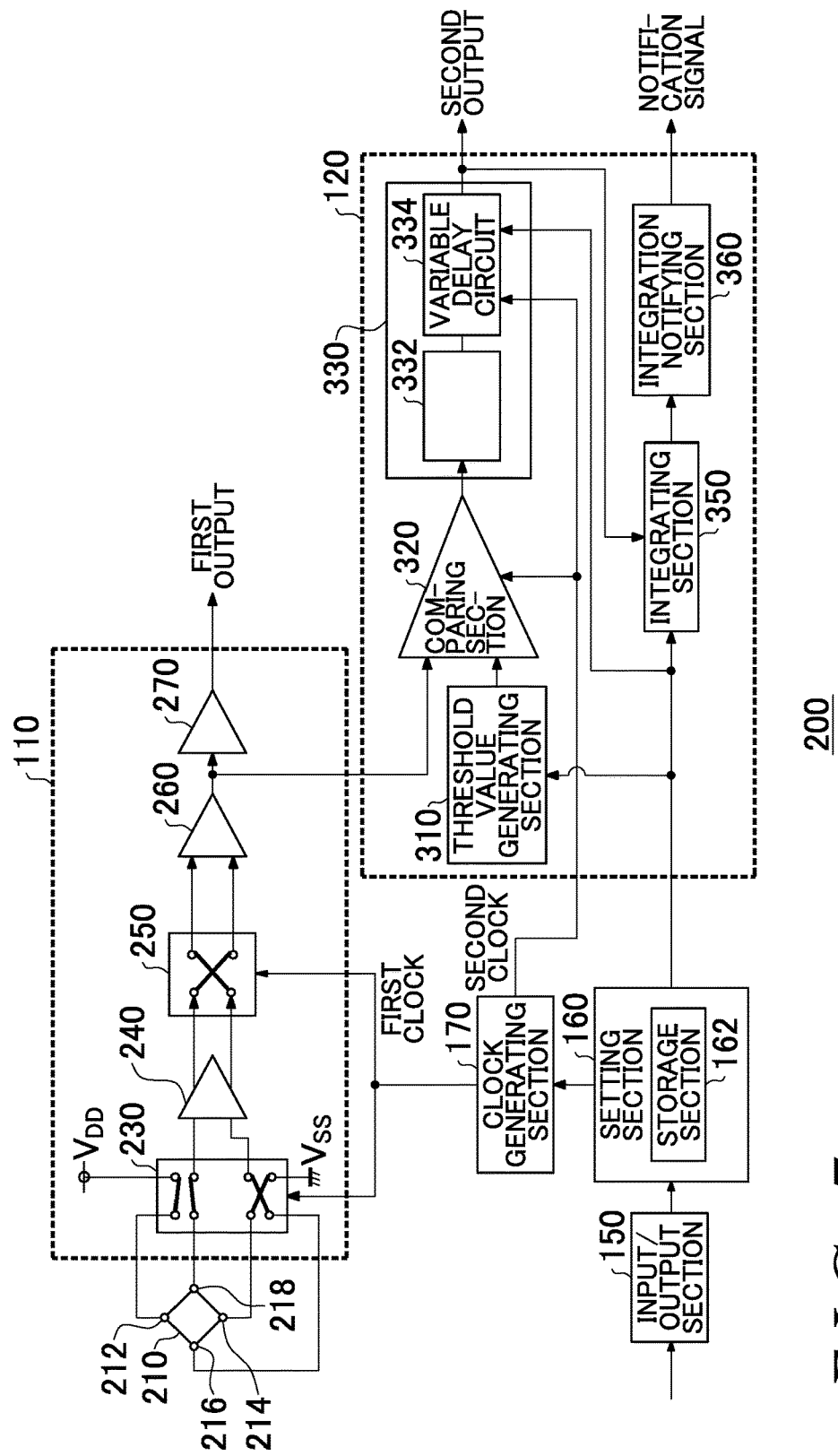
FIG. 7 shows a second modification of the magnetic sensor apparatus 200 according to the present embodiment.

FIG. 7 shows a second modification of the magnetic sensor apparatus 200 according to the present embodiment. In the magnetic sensor apparatus 200 of the second modification, components having substantially the same operation as components in the magnetic sensor apparatus 200 according to the present embodiment shown in FIG. 2 are given the same reference numerals and descriptions thereof are omitted. The magnetic sensor apparatus 200 of the second modification further includes an integrating section 350 and an integration notifying section 360. FIG. 7 shows an example in which the detecting section 120 includes the integrating section 350 and the integration notifying section 360.

The integrating section 350 integrates the comparison result output by the comparing section 320 or the delayed comparison result output by the delaying section 330. FIG. 7 shows an example in which the integrating section 350 integrates the delayed comparison result output by the delaying section 330. The integrating section 350 may increment the count number according to a comparison result with a high potential from the comparing section 320, and may decrement the count number according to a comparison result with a low potential from the comparing section 320. Instead, the integrating section 350 may include a first counter that increments the count number according to a comparison result with a high potential from the comparing section 320, and a second counter that increments the count number according to a comparison result with a low potential from the comparing section 320.

Here, the setting section 160 may set the reference range of the integrating section 350 according to instructions from the outside. For example, the setting section 160 sets an upper limit count value for the high potential and the low potential for the integrating section 350.

The integration notifying section 360 notifies the outside that the integration result of the integrating section 350 is outside the reference range. For example, the integration notifying section 360 outputs a notification signal with a high potential to the outside in response to the number of comparison results with a high potential output by the comparing section 320 exceeding the designated count number. Furthermore, the integration notifying section 360 outputs a notification signal with a low potential to the outside in response to the number of comparison results with a low potential output by the comparing section 320 being below the designated count number. In this way, when a state indicating abnormal output of the magnetic sensor element 210 continues, for example, the magnetic sensor apparatus 200 of the second modification can supply a notification signal to the outside.

The magnetic sensor apparatus 200 of the second modification may also include a plurality of comparing sections 320 and delaying sections 330, as described in FIG. 6. In this case, the magnetic sensor apparatus 200 includes one or more integrating sections 350 that each integrate the comparison result output by a corresponding comparing section 320 among the plurality of comparing sections 320 or the delayed comparison result output by a corresponding delaying section 330 among the plurality of delaying sections 330. Furthermore, the magnetic sensor apparatus 200 includes one or more integration notifying sections 360 that correspond to the one or more integrating sections and each notify the outside that the integration result of the corresponding integrating section 350 is outside the reference range. In other words, the magnetic sensor apparatus 200 may include a plurality of detecting sections 120, and at least one detecting section 120 among the plurality of detecting sections 120 may include an integrating section 350 and an integration notifying section 360.

Figure 8:
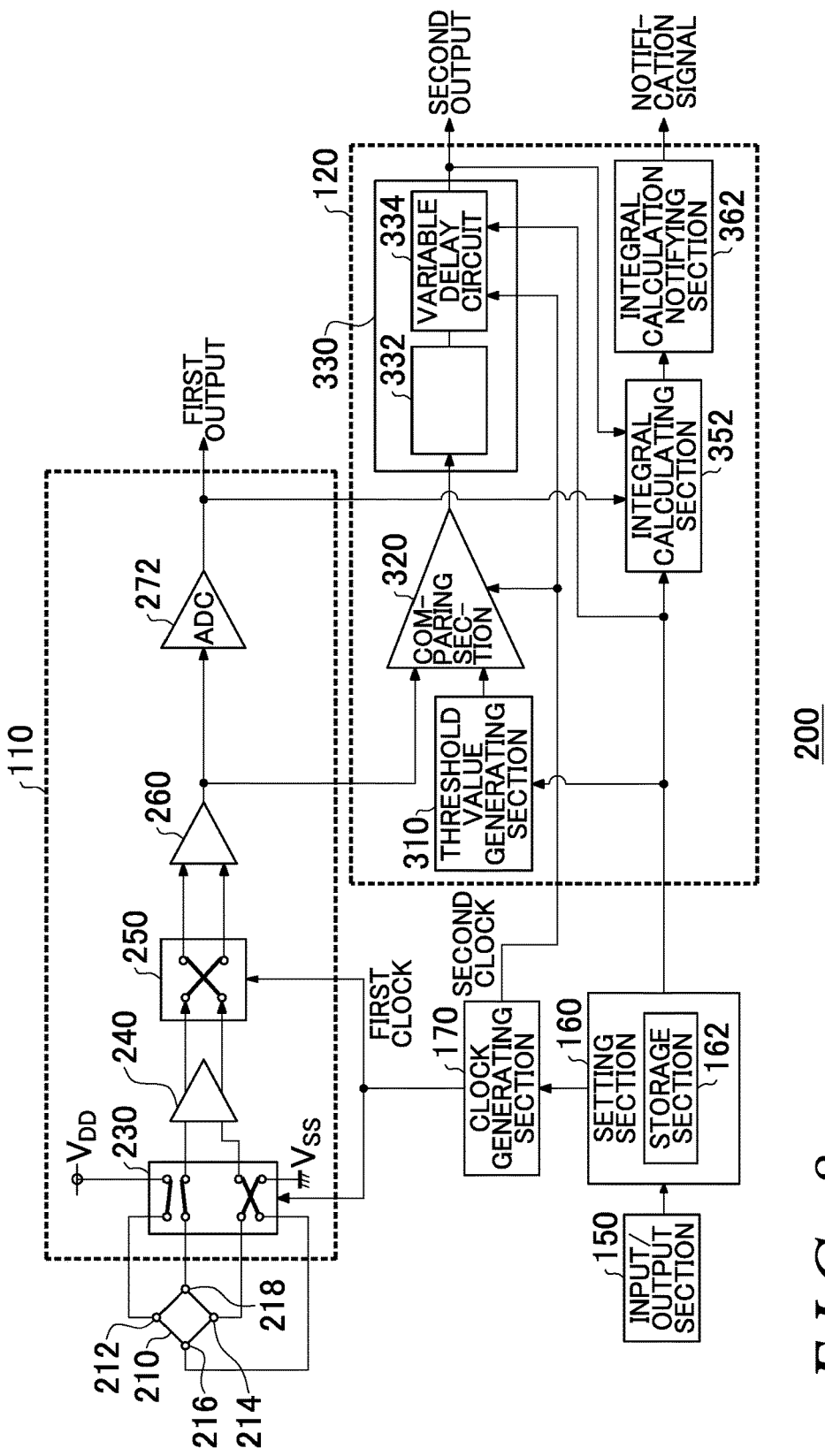
FIG. 8 shows a third modification of the magnetic sensor apparatus 200 according to the present embodiment.

FIG. 8 shows a third modification of the magnetic sensor apparatus 200 according to the present embodiment. In the magnetic sensor apparatus 200 of the third modification, components having substantially the same operation as components in the magnetic sensor apparatus 200 according to the present embodiment shown in FIG. 2 are given the same reference numerals and descriptions thereof are omitted. The magnetic sensor apparatus 200 of the third modification includes an AD converting section 272 instead of the third amplification circuit 270. Furthermore, the magnetic sensor apparatus 200 further includes an integral calculating section 352 and an integral calculation notifying section 362. FIG. 8 shows an example in which the amplifying section 110 includes the AD converting section 272 and the detecting section 120 includes the integral calculating section 352 and the integral calculation notifying section 362.

The AD converting section 272 converts the output signal supplied from the second amplification circuit 260 into a digital signal. Specifically, the amplifying section 110 of the third modification amplifies the output of the magnetic sensor element 210, converts the amplified output into a digital signal, and outputs this digital signal as the first output. The AD converting section 272 may output the converted digital signal from the input/output section 150.

The integral calculating section 352 calculates the integral of the amplified output of the magnetic sensor element 210, in response to the comparison result output by the comparing section 320 or the delayed comparison result output by the delaying section 330 being a predetermined logical value. FIG. 8 shows an example in which the integral calculating section 352 calculates the integral of the delayed comparison result output by the delaying section 330. The integral calculating section 352 calculates the integral of the output from the AD converting section 272 in response to the comparison result of the comparing section 320 being a high potential. By calculating the integral of the output signal of the AD converting section 272, the integral calculating section 352 can calculate the total current amount flowing through a motor or the like generating the magnetic field incident to the magnetic sensor element 210, the amount of power or the like input to this motor, or the like. Furthermore, the integral calculating section 352 may calculate the square integral of the output signal of the AD converting section 272, and in this case as well the integral calculating section 352 can calculate the amount of power input to the motor or the like.

Here, the setting section 160 may set the reference range of the integral calculating section 352 according to instructions from the outside. For example, the setting section 160 sets the total current amount of the integral calculating section 352, an upper limit value for the output power, and/or the like.

The integral calculation notifying section 362 notifies the outside that the integral calculation result of the integral calculating section 352 is outside the reference range. For example, the integral calculation notifying section 362 outputs a notification signal with a high potential to the outside in response to the output of the AD converting section 272 exceeding the designated total current amount. Furthermore, the integration notifying section 360 outputs a notification signal with a low potential to the outside in response to the AD converting section 272 outputting a first output that is less than the designated total current amount. In this way, when a state indicating abnormal output of the magnetic sensor element 210 continues, for example, the magnetic sensor apparatus 200 of the third modification can supply a notification signal to the outside.

There are many cases where the timing at which the AD converting section 272 outputs the first output and the timing at which the comparing section 320 or the delaying section 330 outputs the comparison result are different. For example, in a case where the update rate with which the AD converting section 272 outputs the first output is 12.5 µs and the update rate of the delaying section 330 is 2 µs, the output of the AD converting section 272 to be integrated over 10.5 µs results in an insufficient integral calculation amount.

Therefore, when integral calculation is begun, the integral calculating section 352 may add to the integral value a value obtained by multiplying the output value $V_A(t_0)$ at the time $t_0$ when the output of the AD converting section 272 is first updated after the comparison result becomes a high potential by the difference between the update rate of the AD converting section 272 and the update rate of the delaying section 330. The following describes such an integral calculating section 352.

Figure 9:
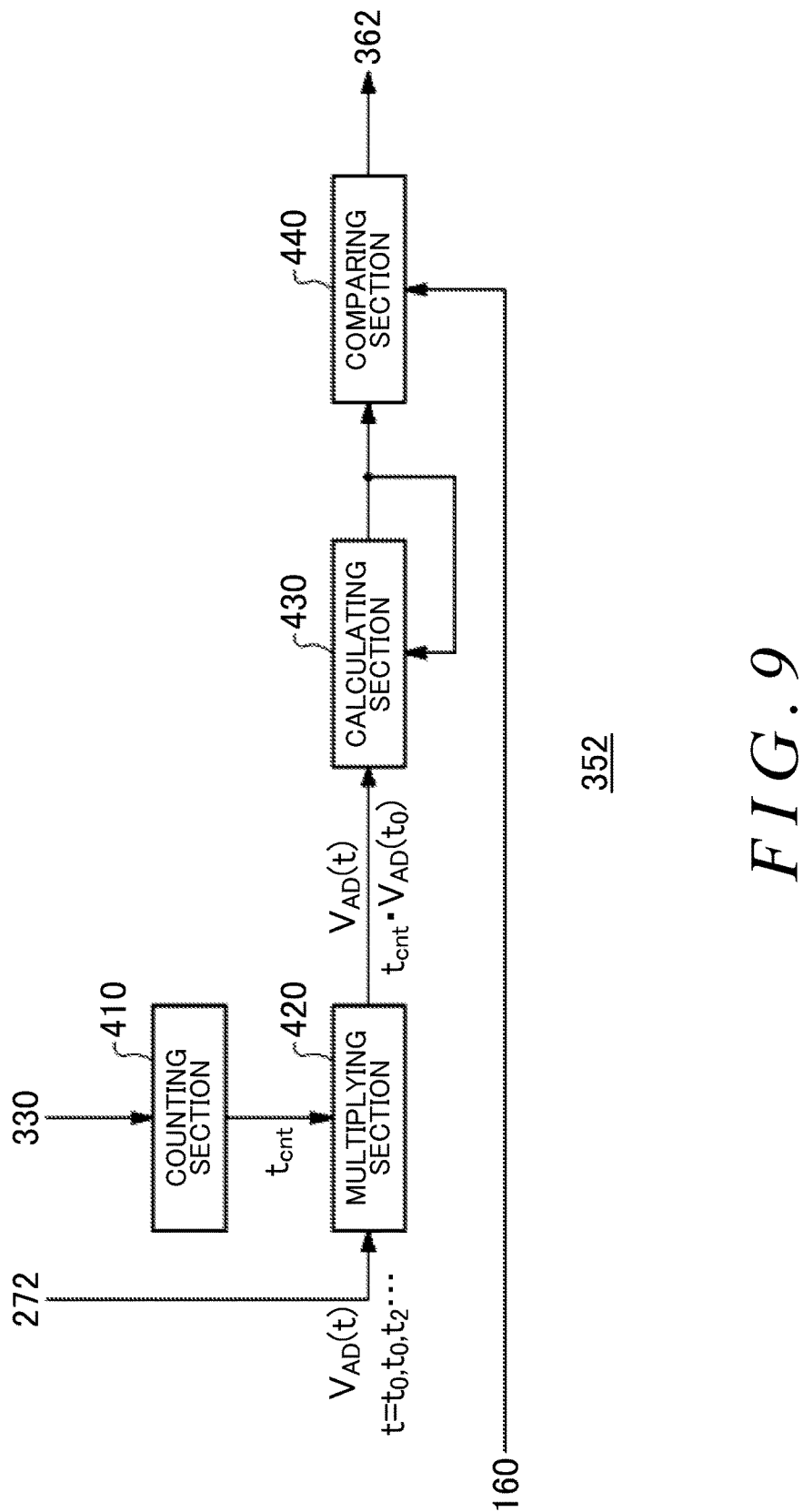
FIG. 9 shows an exemplary configuration of the integral calculating section 352 according to the present embodiment.

FIG. 9 shows an exemplary configuration of the integral calculating section 352 according to the present embodiment. The integral calculating section 352 includes a counting section 410, a multiplying section 420, a calculating section 430, and a comparing section 440. The counting section 410 receives the comparison result of the comparing section 320 that has been delayed and supplied from the delaying section 330. The counting section 410 begins counting from when the comparison result of the comparing section 320 becomes a high potential, and measures the elapsed time from when this comparison result becomes a high potential.

The multiplying section 420 acquires the output $V_{AD}(t)$ of the AD converting section 272 ($t=t_0, t_1, t_2, \ldots$) from when the comparison result becomes a high potential to each time at which the output of the AD converting section 272 is updated from the time $t_0$ and onward. The multiplying section 420 multiplies the output value $V_{AD}(t_0)$ at the time $t_0$ when the output of the AD converting section 272 is updated by the time $t_{cnt}$ counted by the counting section 410 from when the comparison result becomes a high potential to when the output of the AD converting section 272 is updated. The multiplication result $t_{cnt} \cdot V_{AD}(t_0)$ of the multiplying section 420 substantially matches the output of the AD converting section 272 to be integrated over the time during which the AD converting section 272 updates the first output.

The calculating section 430 calculates a value obtained by multiplying the output $V_{AD}(t_k)$ of the AD converting section 272 from the timing $t_0$ and onward by the sampling interval $\Delta t$ of the AD converting section 272, and adds to this multiplication result the multiplication result $t_{cnt} \cdot V_{AD}(t_0)$ of the multiplying section 420. The calculation result S of the calculating section 430 is shown in the following expression. The integral calculating section 352 sets the calculation result S as the integral calculation result.

$$S = t_{cnt} \cdot V_{AD}(t_0) + \Sigma V_{AD}(t_k) \cdot \Delta t \qquad \text{Expression 3:}$$

The comparing section 440 compares the calculation result S to the upper limit value received from the setting section 160. In this way, the comparing section 440 can compare the calculation result S, in which the output of the AD converting section 272 to be integrated has been added, to the upper limit value, and can more accurately perform the comparison.

The magnetic sensor apparatus 200 of the third modification may also include a plurality of comparing sections 320 and delaying sections 330, as described in FIG. 6. In this case, the magnetic sensor apparatus 200 includes one or more integral calculating sections 352 that each calculate the integral of the amplified output of the magnetic sensor element 210, in response to the comparison result output by a corresponding comparing section 320 among the plurality of comparing sections 320 or the delayed comparison result output by a corresponding delaying section 330 among the plurality of delaying sections 330 being a predetermined logic value. Furthermore, the magnetic sensor apparatus 200 includes one or more integral calculation notifying sections 362 that correspond to the one or more integral calculating sections 352 and each notify the outside that the integral calculation result of the corresponding integral calculating section 352 is outside the reference range. In other words, the magnetic sensor apparatus 200 may include a plurality of detecting sections 120, and at least one detecting section 120 among the plurality of detecting sections 120 may include an integral calculating section 352 and an integral calculation notifying section 362.

Figure 10:
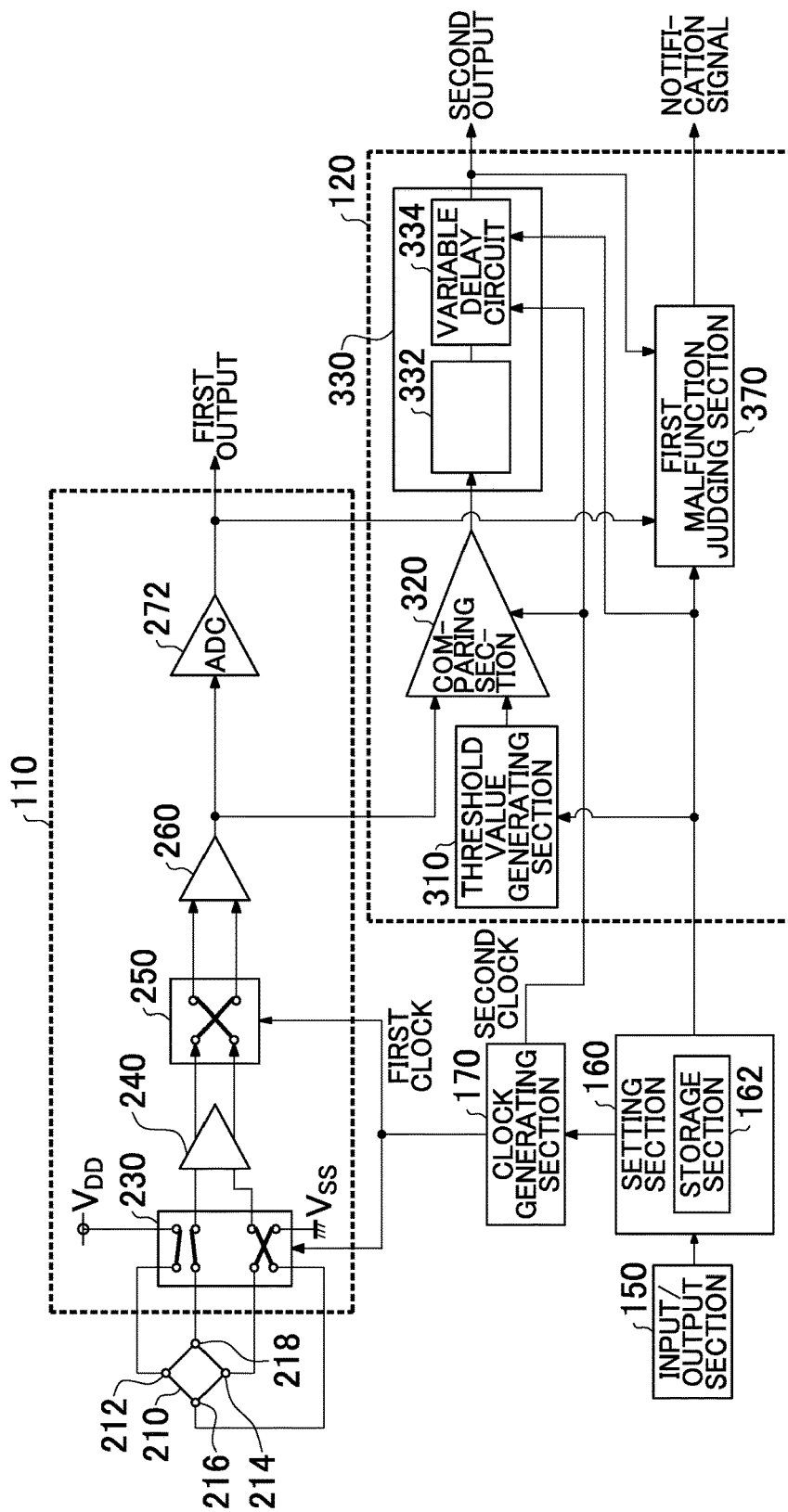
FIG. 10 shows a fourth modification of the magnetic sensor apparatus 200 according to the present embodiment.

FIG. 10 shows a fourth modification of the magnetic sensor apparatus 200 according to the present embodiment. In the magnetic sensor apparatus 200 of the fourth modification, components having substantially the same operation as components in the magnetic sensor apparatus 200 according to the present embodiment shown in FIG. 2 or FIG. 8 are given the same reference numerals and descriptions thereof are omitted. The magnetic sensor apparatus 200 of the fourth modification includes a first malfunction judging section 370 to judge its own malfunctioning. Furthermore, the magnetic sensor apparatus 200 includes the AD converting section 272 instead of the third amplification circuit 270. FIG. 10 shows an example in which the amplifying section 110 includes the AD converting section 272, and the detecting section 120 includes the first malfunction judging section 370.

The first malfunction judging section 370 judges that there is a malfunction in response to the digital signal not being the value corresponding to the logical value of the comparison result output by the comparing section 320 or the delayed comparison result output by the delaying section 330. FIG. 10 shows an example in which the first malfunction judging section 370 acquires the delayed comparison result output by the delaying section 330 and judges whether this comparison result corresponds to the digital signal from the AD converting section 272.

Here, the setting section 160 may supply the first malfunction judging section 370 with the digital value of the threshold value corresponding to the threshold value set in the threshold value generating section 310. The first malfunction judging section 370 compares the digital value of this threshold value to the output of the AD converting section 272. The first malfunction judging section 370 judges that the magnetic sensor apparatus 200 has malfunctioned if its own comparison result does not match the comparison result of the comparing section 320. The first malfunction judging section 370 may notify the outside about the judgment result when it is judged that there is a malfunction.

If the output timing of the AD converting section 272 is different from the output timing of the comparison result of the comparing section 320 or the delaying section 330, the first malfunction judging section 370 may continue making the malfunction judgment until a time greater than or equal to the time corresponding to the timing difference has elapsed. While the malfunction judgment continues, the first malfunction judging section 370 may judge the magnetic sensor apparatus 200 to be malfunctioning if its own comparison result does not correspond to the comparison result of the comparing section 320. In the manner described above, the magnetic sensor apparatus 200 of the fourth modification can judge whether there is a malfunction inside an apparatus.

The magnetic sensor apparatus 200 of the fourth modification may also include a plurality of comparing sections 320 and delaying sections 330, as described in FIG. 6. In this case, the magnetic sensor apparatus 200 includes one or more first malfunction judging sections 370 that each judge whether there is a malfunction in response to the digital signal output by the amplifying section 110 not being the value corresponding to the logical value of the comparison result output by a corresponding comparing section 320 among the plurality of comparing sections 320 or the delayed comparison result output by a corresponding delaying section 330 among the plurality of delaying sections 330. In other words, the magnetic sensor apparatus 200 may include a plurality of detecting sections 120, and at least one detecting section 120 among the plurality of detecting sections 120 may include a first malfunction judging section 370.

Figure 11:
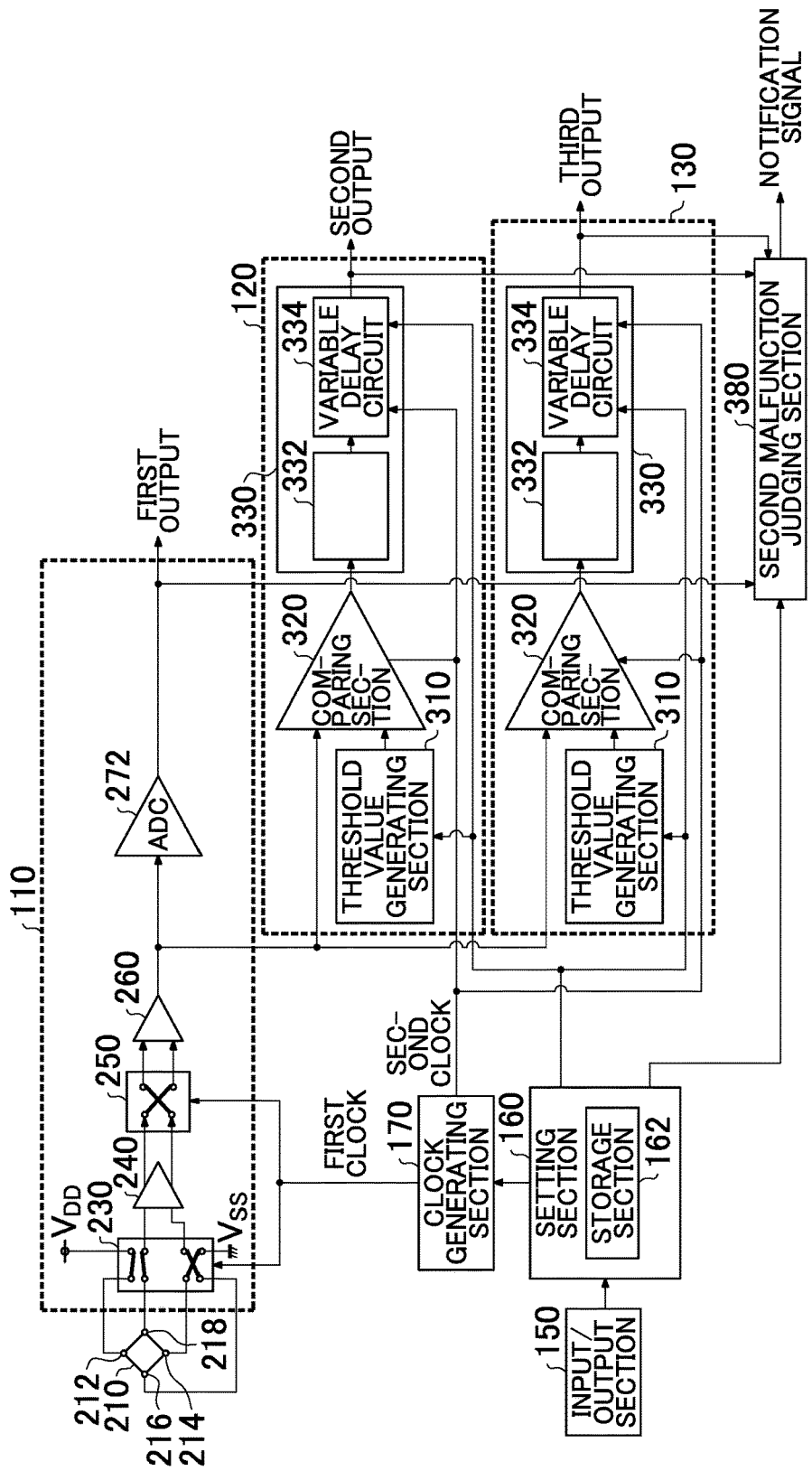
FIG. 11 shows a fifth modification of the magnetic sensor apparatus 200 according to the present embodiment.

FIG. 11 shows a fifth modification of the magnetic sensor apparatus 200 according to the present embodiment. In the magnetic sensor apparatus 200 of the fifth modification, components having substantially the same operation as components in the magnetic sensor apparatus 200 according to the present embodiment shown in FIG. 2 or FIG. 6 are given the same reference numerals and descriptions thereof are omitted. The magnetic sensor apparatus 200 of the fifth modification includes a plurality of detecting sections and a second malfunction judging section 380, to judge its own malfunctioning. Furthermore, the magnetic sensor apparatus 200 includes the AD converting section 272 instead of the third amplification circuit 270. FIG. 11 shows an example in which the magnetic sensor apparatus 200 includes the detecting section 120 that outputs the second output and the detecting section 130 that outputs the third output, and the amplifying section 110 includes the AD converting section 272.

The second malfunction judging section 380 judges whether there is a malfunction according to a result obtained by comparing the comparison result output by the comparing section 320 or the delayed comparison result output by the delaying section 330 in a first set of a comparing section 320 and a delaying section 330 to the comparison result output by the comparing section 320 or the delayed comparison result output by the delaying section 330 in a second set of a comparing section 320 and a delaying section 330. FIG. 11 shows an example in which the second malfunction judging section 380 compares the delayed comparison result output by the delaying section 330 of the detecting section 120 to the delayed comparison result output by the delaying section 330 of the detecting section 130.

Here, as one example, the upper threshold voltage of the detecting section 120 is smaller than the upper threshold voltage of the detecting section 130. Furthermore, the lower threshold voltage of the detecting section 120 is larger than the lower threshold voltage of the detecting section 130. Yet further, the delay amount of the detecting section 120 is less than the delay amount of the detecting section 130. In this case, it is impossible for the third output of the detecting section 130 to become a high potential earlier in time than the second output of the detecting section 120. Furthermore, it is impossible for the second output of the detecting section 120 to become a low potential earlier in time than the third output of the detecting section 130.

Accordingly, the second malfunction judging section 380 judges that the magnetic sensor apparatus 200 has malfunctioned in response to the third output of the detecting section 130 becoming a high potential earlier in time than the second output of the detecting section 120 and/or the second output of the detecting section 120 becoming a low potential earlier in time than the third output of the detecting section 130. The second malfunction judging section 380 may notify the outside about the judgment result when it is judged that there is a malfunction.

The setting section 160 may supply the second malfunction judging section 380 with the digital values of the threshold values corresponding to the threshold values set in the threshold value generating sections 310 of the detecting section 120 and the detecting section 130. The second malfunction judging section 380 compares the digital values of these threshold values to the output of the AD converting section 272. The second malfunction judging section 380 judges that the magnetic sensor apparatus 200 has malfunctioned if its own comparison result does not correspond to the comparison results of the comparing sections 320 of the detecting section 120 and the detecting section 130. The second malfunction judging section 380 may notify the outside about the judgment result when it is judged that there is a malfunction.

If the output timing of the AD converting section 272 is different from the output timing of the comparison result of the comparing sections 320 or the delaying sections 330 in the detecting section 120 and the detecting section 130, the second malfunction judging section 380 may continue making the malfunction judgment until a time greater than or equal to the time corresponding to the timing difference has elapsed, as described in FIG. 10. In the manner described above, the magnetic sensor apparatus 200 of the fifth modification can judge whether there is a malfunction inside an apparatus.

The magnetic sensor apparatus 200 according to the present embodiment described above is an example in which the comparison result output by the comparing section 320 is delayed and output by the delaying section 330. In addition to this, the magnetic sensor apparatus 200 may delay the signal input to the comparing section 320. The following describes an example of such a magnetic sensor apparatus 200.

Figure 12:
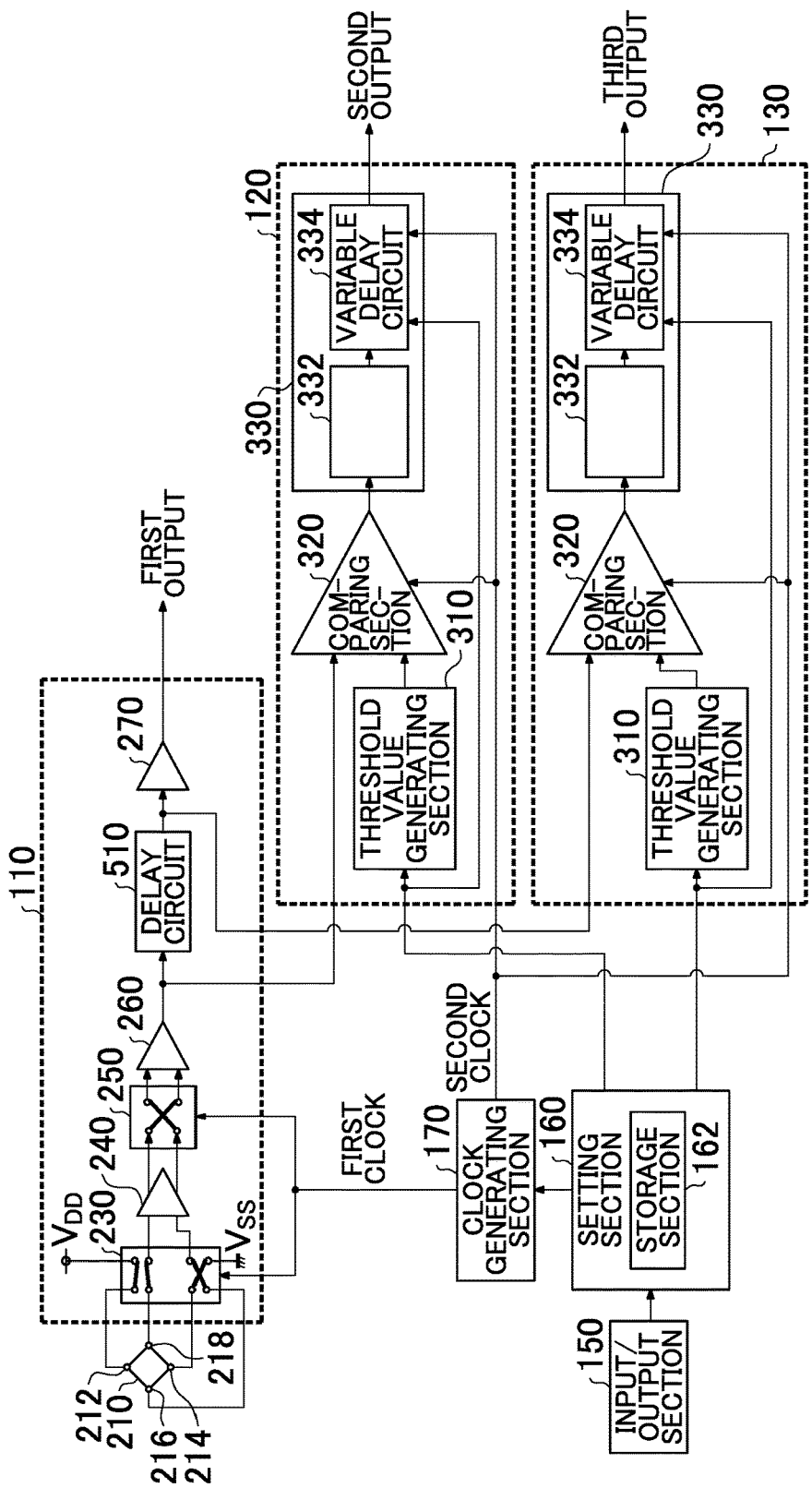
FIG. 12 shows a sixth modification of the magnetic sensor apparatus 200 according to the present embodiment.

FIG. 12 shows a sixth modification of the magnetic sensor apparatus 200 according to the present embodiment. In the magnetic sensor apparatus 200 of the sixth modification, components having substantially the same operation as components in the magnetic sensor apparatus 200 according to the present embodiment shown in FIG. 6 are given the same reference numerals and descriptions thereof are omitted. The magnetic sensor apparatus 200 of the sixth modification is an example further including a delay circuit 510.

The delay circuit 510 delays the output of the magnetic sensor element 210. The delay circuit 510 may be a delay circuit in which the delay amount is fixed, or may instead be a delay circuit in which the delay amount is variable. The delay circuit 510 may include a buffer amplifier, a delay line, and/or the like.

The delay circuit 510 may include a filter that reduces noise. In this case, the filter may form a low-pass filter and may be used to remove ripples or the like. Furthermore, the delay circuit 510 may include an anti-alias filter, a band-pass filter, a notch filter, and/or the like. The delay circuit 510 may include a resistor with a fixed resistance value and/or a variable resistor with a resistance value that can be changed. The delay circuit 510 may include a capacitor with a fixed capacitance and/or a variable capacitor in which the capacitance can be changed.

FIG. 12 shows an example in which the delay circuit 510 is provided in the amplifying section 110. Furthermore, FIG. 12 shows an example in which the delay circuit 510 is provided between the second amplification circuit 260 and the third amplification circuit 270. Among a plurality of sets of a comparing section 320 and a delaying section 330, the comparing section 320 of a first set compares the input of the delay circuit 510 to a first threshold value. Among the plurality of sets of a comparing section 320 and a delaying section 330, the comparing section 320 of a second set compares the output of the delay circuit 510 to a second threshold value.

Specifically, FIG. 12 shows an example in which the comparing section 320 of the detecting section 120 compares the output of the second amplification circuit 260 to the first threshold value, and the comparing section 320 of the detecting section 130 compares the output of the delay circuit 510 to the second threshold value. In this way, the detecting section 130 receives the amplified signal from the amplifying section 110 at a timing delayed by the delay time of the delay circuit 510 relative to the timing at which the detecting section 120 receives the amplified signal from the amplifying section 110.

In this way, the magnetic sensor apparatus 200 of the sixth modification can adjust the timings at which the threshold value comparison operations are performed in the detecting section 120 and the detecting section 130. Furthermore, by including the filter or the like in the delay circuit 510, the magnetic sensor apparatus 200 can reduce the noise along with delaying the signal. Accordingly, since the magnetic sensor apparatus 200 uses the output of the second amplification circuit 260 for control that is to be processed at high speed, the magnetic sensor apparatus 200 can perform the comparison operation of the comparing section 320 at high speed. Furthermore, since the magnetic sensor apparatus 200 uses the signal with reduced noise that has passed through the delay circuit 510 for control in which the processing is delayed, the magnetic sensor apparatus 200 can accurately perform the comparison operation of the comparing section 320.

For example, according to the magnetic field of the current serving as a measurement target, the magnetic sensor apparatus 200 performs the operation of judging the range of the output signal indicating a severe abnormality such as overcurrent at high speed using the comparing section 320 of the detecting section 120. In this way, the magnetic sensor apparatus 200 can more quickly perform the operation of detecting a severe abnormality and prevent damage, deterioration, and the like. Furthermore, when performing feedback control in a manner to cause the output of the magnetic sensor element 210 to be in a normal operating range, the magnetic sensor apparatus 200 can use the signal with reduced noise that has passed through the delay circuit 510, and can therefore use a more accurate comparison operation.

Furthermore, the magnetic sensor apparatus 200 of the sixth modification can adjust the output timings of the second output that is output by the detecting section 120 and the third output that is output by the detecting section 130, using the delay time of the delay circuit 510. Accordingly, the magnetic sensor apparatus 200 of the sixth modification can adjust the output timings of the second output and the third output within a time range that is larger than the difference between the delay times that can be set by the delaying section 330 of the detecting section 120 and the delaying section 330 of the detecting section 130. Furthermore, since the delay circuit 510 is provided in the amplifying section 110, the magnetic sensor apparatus 200 of the sixth modification can output the first output with reduced noise from the amplifying section 110.

Figure 13:
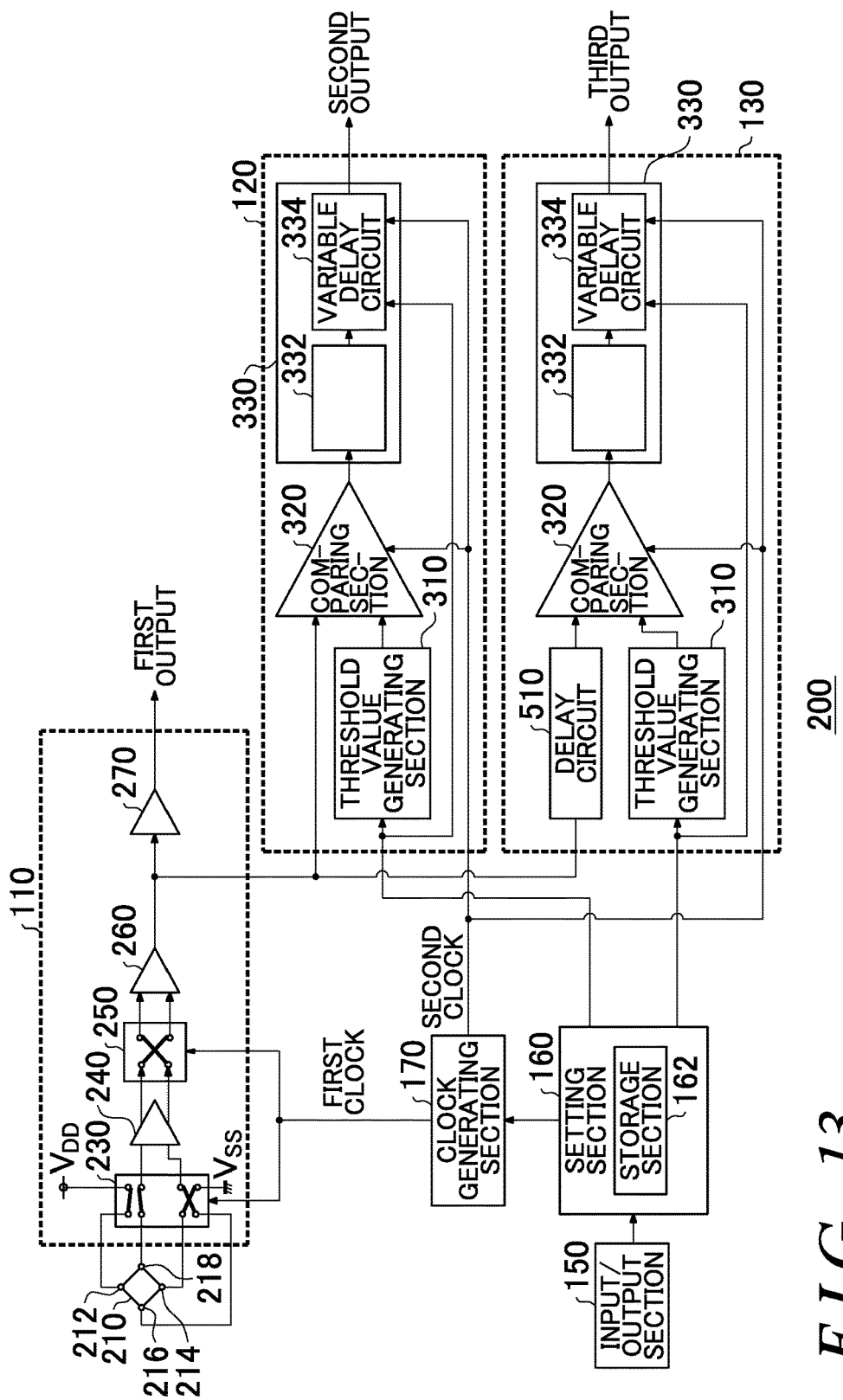
FIG. 13 shows a seventh modification of the magnetic sensor apparatus 200 according to the present embodiment.

FIG. 13 shows a seventh modification of the magnetic sensor apparatus 200 according to the present embodiment. In the magnetic sensor apparatus 200 of the seventh modification, components having substantially the same operation as components in the magnetic sensor apparatus 200 according to the present embodiment shown in FIG. 12 are given the same reference numerals and descriptions thereof are omitted. The magnetic sensor apparatus 200 of the seventh modification is an example in which the delay circuit 510 is provided in the detecting section 130.

FIG. 13 shows an example in which the delay circuit 510 is provided between the second amplification circuit 260 and the comparing section 320 of the detecting section 130. In this case as well, among a plurality of sets of a comparing section 320 and a delaying section 330, the comparing section 320 of a first set compares the input of the delay circuit 510 to a first threshold value and the comparing section 320 of a second set compares the output of the delay circuit 510 to a second threshold value.

Accordingly, the magnetic sensor apparatus 200 of the seventh modification can adjust the timings of the threshold value comparison operations in the detecting section 120 and the detecting section 130, in the same manner as the magnetic sensor apparatus 200 of the sixth modification. Furthermore, since the delay circuit 510 is provided in the detecting section 130, the magnetic sensor apparatus 200 of the seventh modification can output the first output from the amplifying section 110 without causing a delay in the first output. Yet further, by including a filter or the like in the delay circuit 510, the magnetic sensor apparatus 200 can accurately perform the comparison operation of the comparing section 320 in the second set.

Figure 14:
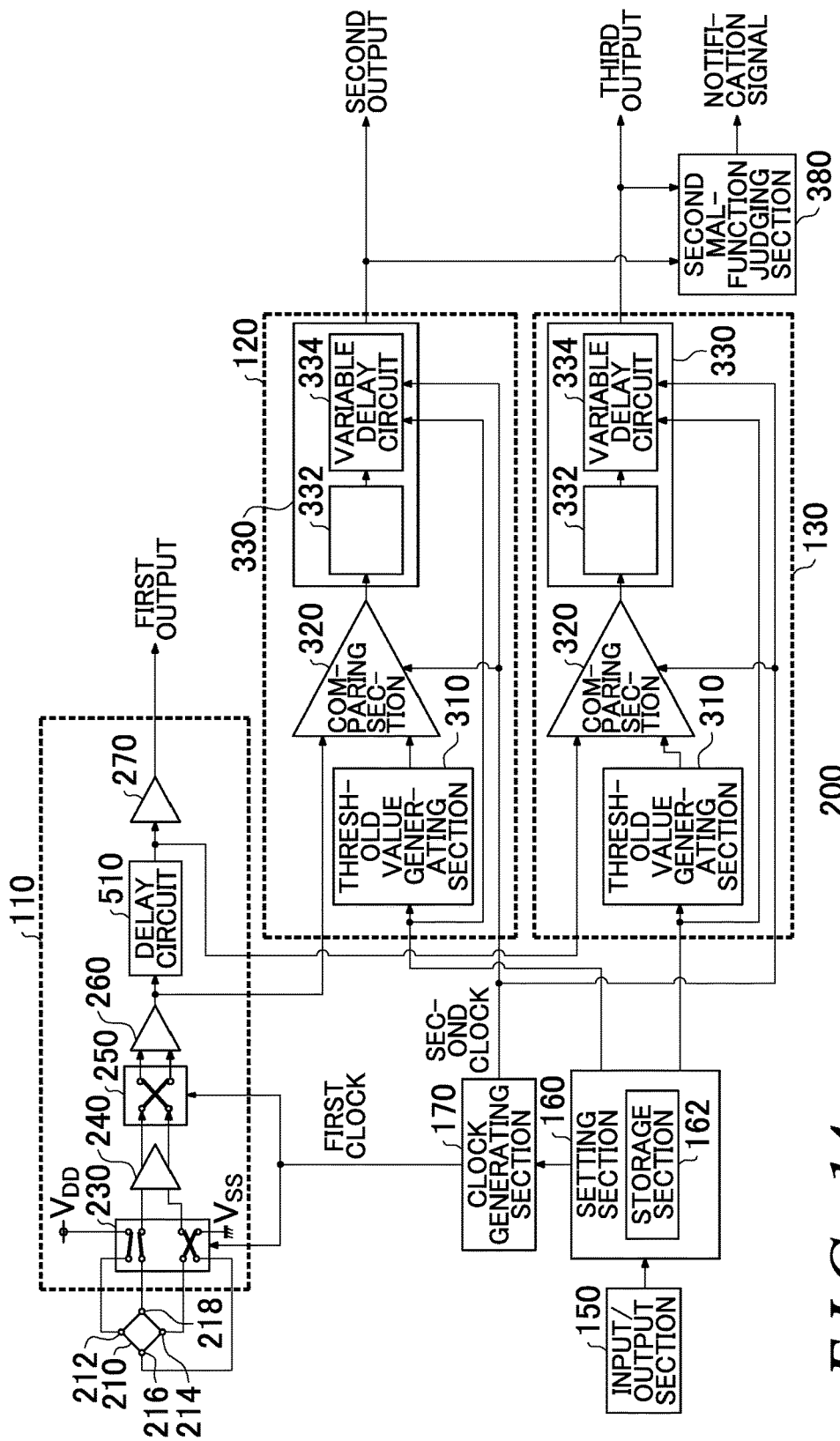
FIG. 14 shows an eighth modification of the magnetic sensor apparatus 200 according to the present embodiment.

FIG. 14 shows an eighth modification of the magnetic sensor apparatus 200 according to the present embodiment. In the magnetic sensor apparatus 200 of the eighth modification, components having substantially the same operation as components in the magnetic sensor apparatus 200 according to the present embodiment shown in FIG. 11 or FIG. 12 are given the same reference numerals and descriptions thereof are omitted. The magnetic sensor apparatus 200 of the eighth modification is an example that includes the delay circuit 510 and the second malfunction judging section 380.

The delay circuit 510 adjusts the timings of the threshold value comparison operations in the detecting section 120 and the detecting section 130, as described in FIG. 12. The delay circuit 510 may be provided in the amplifying section 110 as shown in the example of FIG. 14, or may instead be provided in the detecting section 130. If the delay circuit 510 is provided in the detecting section 130, the delay circuit 510 may be provided in front of the comparing section 320.

The second malfunction judging section 380 judges whether there is a malfunction, according to the result of a comparison between the second output of the detecting section 120 and the third output of the detecting section 130, as described in FIG. 11. The second malfunction judging section 380 can easily judge whether the magnetic sensor apparatus 200 is malfunctioning, by detecting the timings at which the second output and the third output are output as a high potential or a low potential.

Figure 15:
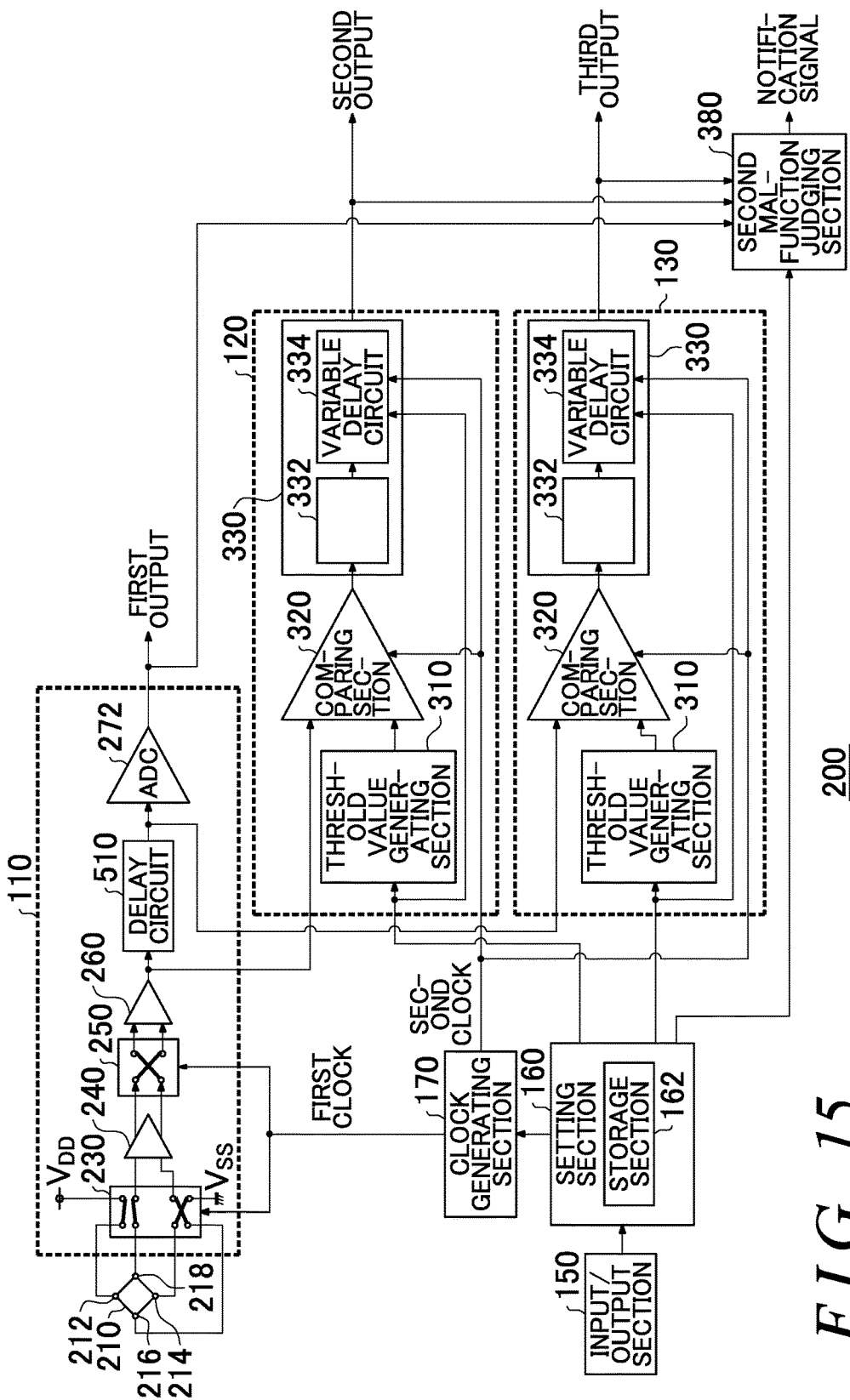
FIG. 15 shows a ninth modification of the magnetic sensor apparatus 200 according to the present embodiment.

FIG. 15 shows a ninth modification of the magnetic sensor apparatus 200 according to the present embodiment. In the magnetic sensor apparatus 200 of the ninth modification, components having substantially the same operation as components in the magnetic sensor apparatus 200 according to the present embodiment shown in FIG. 11 or FIG. 12 are given the same reference numerals and descriptions thereof are omitted. The magnetic sensor apparatus 200 of the ninth modification is an example including the delay circuit 510 and the second malfunction judging section 380.

Furthermore, the magnetic sensor apparatus 200 of the ninth modification includes the AD converting section 272 instead of the third amplification circuit 270. The AD converting section 272 converts the output of the delay circuit 510 into a digital signal and outputs this digital signal.

The delay circuit 510 adjusts the timings of the threshold value comparison operations in the detecting section 120 and the detecting section 130, as described in FIG. 12. The delay circuit 510 may be provided in the amplifying section 110 as shown in the example of FIG. 14, or may instead be provided in the detecting section 130. If the delay circuit 510 is provided in the detecting section 130, the delay circuit 510 may be provided in front of the comparing section 320.

The second malfunction judging section 380 judges whether there is a malfunction, according to the result of a comparison between the second output of the detecting section 120 and the third output of the detecting section 130, as described in FIG. 11. The second malfunction judging section 380 can easily judge whether the magnetic sensor apparatus 200 is malfunctioning, by detecting the timings at which the second output and the third output are output as a high potential or a low potential.

Furthermore, the setting section 160 may supply the second malfunction judging section 380 with the digital values corresponding respectively to the first threshold value and the second threshold value set in each threshold value generating section 310 of the detecting section 120 and the detecting section 130. The second malfunction judging section 380 compares the digital values of these threshold values to the output of the AD converting section 272. The second malfunction judging section 380 then judges that the magnetic sensor apparatus 200 has malfunctioned if its own comparison result does not correspond to the comparison results of the comparing sections 320 of the detecting section 120 and the detecting section 130. The second malfunction judging section 380 may notify the outside about the judgment result when it is judged that there is a malfunction.

If the output timing of the AD converting section 272 is different from the output timing of the comparison result of the comparing section 320 or the delaying section 330 of the detecting section 120 and the detecting section 130, as described in FIG. 10, the second malfunction judging section 380 may continue making the malfunction judgment until a time greater than or equal to the time corresponding to the timing difference has elapsed. In the manner described above, the magnetic sensor apparatus 200 of the ninth modification can judge whether there is a malfunction inside an apparatus.

The magnetic sensor apparatus 200 according to the present embodiment described above is an example in which the comparing section 320 compares the output of the amplifying section 110 to a threshold value. Here, the comparing section 320 may compare the output of any other component inside the amplifying section 110 to the threshold value, as long as the comparing section 320 is able to detect abnormal output of the magnetic sensor element 210. Furthermore, the comparing section 320 may compare the output of the magnetic sensor element 210 to the threshold value.

Figure 16:
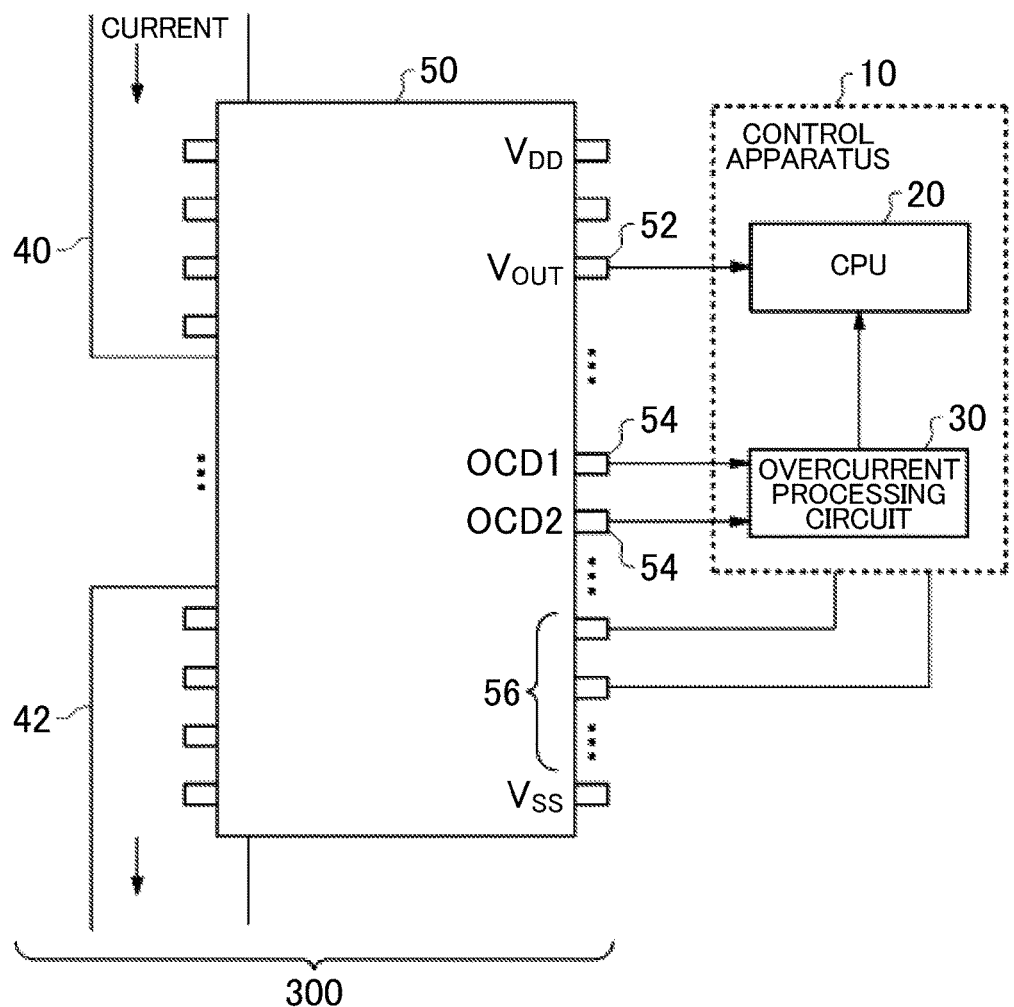
FIG. 16 shows a package 50 in which the magnetic sensor apparatus 200 is implemented and an exemplary configuration of a current sensor apparatus 300 includes the package 50, according to the present embodiment.

FIG. 16 shows a package 50 in which the magnetic sensor apparatus 200 is implemented and an exemplary configuration of a current sensor apparatus 300 that includes the package 50, according to the present embodiment. The control apparatus 10 connected to the current sensor apparatus 300 according to the present embodiment performs substantially the same operation as the control apparatus 10 connected to the sensor apparatus 100 according to the embodiment shown in FIG. 1, and is therefore given the same reference numeral and a description thereof is omitted.

The package 50 has the magnetic sensor apparatus 200 implemented therein. The package 50 includes a first output terminal 52 that outputs the output signal of the amplifying section and a second output terminal 54 that outputs the output signal of the delaying section 330. Furthermore, if the magnetic sensor apparatus 200 implemented in the package 50 includes a plurality of detecting sections 120, the package 50 may include a plurality of the second output terminals 54 corresponding to the plurality of detecting sections 120. In other words, the package 50 includes one or more second output terminals 54. These one or more second output terminals 54 each output the output signal of a corresponding delaying section 330 among the plurality of delaying sections 330. Furthermore, the package 50 may include an input/output terminal 56 corresponding to the input/output section 150. The package 50 may further include a power supply terminal that is connected to the power supply voltage $V_{DD}$ and a reference potential terminal that is connected to the reference potential $V_{SS}$.

In this way, the control apparatus 10 can supply a signal designating the settings of the packaged magnetic sensor apparatus 200 and can receive the first output, the second output, and the like output by the magnetic sensor apparatus 200 in response to this designation. Furthermore, by being implemented in the package 50, the magnetic sensor apparatus 200 can be easily mounted in an external apparatus or the like, as a small and light-weight magnetic sensor.

The package 50 may be connected to a current path through which a current serving as a measurement target flows. FIG. 16 shows an example in which the package 50 is connected between the current path 40 and the current path 42. Specifically, the magnetic sensor apparatus 200 is arranged corresponding to the current path 40 and the current path 42, and detects the magnetic field generated according to the current serving as the measurement target. In this way, the current path 40, the current path 42, and the magnetic sensor apparatus 200 can form a current sensor apparatus 300.

Accordingly, when the control apparatus 10 drives a motor or the like, by providing the current sensor apparatus 300 in the current path through which the drive current is supplied to the motor, the current sensor apparatus 300 can detect fluctuation of the drive current. Furthermore, the current sensor apparatus 300 can notify the control apparatus 10 that the drive current is an overcurrent or an undercurrent. The control apparatus 10 can stably control the motor drive based on the detection results indicating variation of the drive current, an overcurrent, or an undercurrent.

In the description of the embodiments provided above, the glitch filter 332 and the variable delay circuit 334 are described separately, but the function of the glitch filter 332 may be included in the variable delay circuit 334. In this case as well, the number of judgments until removal or the time until removal when the variable delay circuit 334 removes the glitches may be set according to instructions from the outside.

In the description of the embodiments provided above, the comparing section 320, the glitch filter 332, and the variable delay circuit 334 are described as operating according to the second clock, but instead, the glitch filter 332 and the variable delay circuit 334 may be provided with a third clock differing from the second clock in order to operate. The third clock may be a clock having a different phase than the second clock. Instead of or in addition to this, the third clock may have a frequency that is a multiple of an integer greater than or equal to two of the second clock. In this way, the delay of the delaying section 330 can be more finely adjusted.

For example, in a case where the second clock is 1 MHz and the third clock is 10 MHz, the judgment by the comparing section can be performed at intervals of 1 µs and the delay by the delaying section 330 can be adjusted with a time resolution of 100 ns. Furthermore, the comparing section 320 may operate constantly regardless of the second clock and the delaying section 330 may operate according to the second clock. In this case, the comparing section 320 constantly performs the comparison operation. In this case, the comparing section 320 outputs a judgment result with spike noise, but it is possible to reduce the spike noise as a result of the glitch filter 332 removing the portion of time including the noise. Also in this case, the second clock does not need to have a different phase than the first clock.

The sixth to ninth modifications (FIGS. 12, 13, 14, and 15) of the embodiments described above are examples in which the delay circuit 510 is provided in the amplifying section 110 or in the detecting section 130, but the present invention is not limited to this, and the delay circuit 510 may be provided in front of the comparing section 320 of the detecting section 120 and the comparing section 320 of the detecting section 130. In this way, by including a filter or the like in the delay circuit 510, the magnetic sensor apparatus 200 can accurately perform the comparison operations of the comparing sections 320 in the first set and the second set.

If the delay circuit 510 is provided in front of the comparing section 320 of the detecting section 120 and the detecting section 130, the delaying sections 330 do not need to be provided. In this case as well, by setting different values for the respective delay amounts of the delay circuits, for example, it is possible to realize fine control of the control apparatus 10.

In the second to fifth, eighth, and ninth modifications (FIGS. 7, 8, 10, 11, 14, and 15) of the embodiments described above, the magnetic sensor apparatus 200 may output the notification signal to the outside from the input/output section 150. Alternatively, the magnetic sensor apparatus 200 may supply the outside with an output value of the notification signal that is outside of the rated output range of the first output. For example, in the second modification, if the rated output voltages are 4.5 V and 0.5 V, the magnetic sensor apparatus 200 may supply the outside with voltages of 4.9 V and 0.1 V, for example. Furthermore, in the third to fifth and ninth modifications, the magnetic sensor apparatus 200 may supply the outside with a digital value other than the digital values of the rated output range. In this way, the magnetic sensor apparatus 200 can superimpose the notification signal on another signal when communicating with the outside, and can transmit the notification signal without increasing the number of signal lines.

As described in the second to fifth, eighth, and ninth modifications (FIGS. 7, 8, 10, 11, 14, and 15) of the embodiments described above, a diagnostic of the abnormal state of the output of the magnetic sensor element 210 and a malfunction diagnostic of an apparatus are useful in situations where there is a strict demand for safety, such as in vehicles. In particular, these diagnostics are useful in the construction of systems that conform to functional safety standards such as ISO26262, and as described in the embodiments, it is possible to provide a magnetic sensor apparatus 200 that is suitable for use in vehicles and the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order. According to the present application, the following configurations are also disclosed.

(Item 1) A magnetic sensor apparatus comprising:
a magnetic sensor element;
an amplifying section that amplifies and outputs an output of the magnetic sensor element;
a comparing section that compares the output of the magnetic sensor element or an output of the amplifying section to a threshold value; and
a delaying section that delays and outputs a comparison result output by the comparing section.

(Item 2) The magnetic sensor apparatus according to Item 1, wherein
the delaying section includes a variable delay circuit, and
the magnetic sensor apparatus further comprises a setting section that sets a delay amount of the variable delay circuit, according to instructions from outside.

(Item 3) The magnetic sensor apparatus according to Item 2, wherein the delaying section further includes a glitch filter that removes a glitch in the comparison result output by the comparing section, and
the variable delay circuit delays and outputs the comparison result that has passed through the glitch filter.

(Item 4) The magnetic sensor apparatus according to any one of Items 1 to 3, wherein
the magnetic sensor element is a Hall element that has a first terminal pair and a second terminal pair, and
the amplifying section includes a switching section that switches a terminal pair causing a drive current to flow and a terminal pair that senses the output of the magnetic sensor element, between the first terminal pair and the second terminal pair of the magnetic sensor element, according to a first clock supplied from outside.

(Item 5) The magnetic sensor apparatus according to Item 4, further comprising:
a clock generating section that generates a second clock, which has a frequency that is an integer multiple of a frequency of the first clock and a predetermined phase difference relative to a timing of the first clock.

(Item 6) The magnetic sensor apparatus according to Item 5, wherein
the comparing section compares the output of the magnetic sensor element or the output of the amplifying section to the threshold value according to the second clock.

(Item 7) The magnetic sensor apparatus according to Item 5 or 6, wherein
the delaying section delays the comparison result according to the second clock.

(Item 8) The magnetic sensor apparatus according to any one of Items 1 to 7, further comprising:
an integrating section that integrates the comparison result output by the comparing section or the delayed comparison result output by the delaying section; and an integration notifying section that notifies to outside that an integration result of the integrating section is outside a reference range.

(Item 9) The magnetic sensor apparatus according to any one of Items 1 to 7, further comprising:
an integral calculating section that calculates an integral of the amplified output of the magnetic sensor element, in response to the comparison result output by the comparing section or the delayed comparison result output by the delaying section being a predetermined logic value; and an integral calculation notifying section that notifies to outside that an integral calculation result of the integral calculating section is outside a reference range.

(Item 10) The magnetic sensor apparatus according to any one of Items 1 to 9, wherein
the amplifying section amplifies the output of the magnetic sensor element, converts the amplified output into a digital signal, and outputs the digital signal, and
the magnetic sensor apparatus further comprises a first malfunction judging section that determines there is a malfunction in response to the digital signal not being a value corresponding to a logical value of the comparison result output by the comparing section or the delayed comparison result output by the delaying section.

(Item 11) The magnetic sensor apparatus according to any one of Items 1 to 10, further comprising:
a plurality of sets that each include the comparing section and the delaying section.

(Item 12) The magnetic sensor apparatus according to Item 11, wherein
among the plurality of sets that each include the comparing section and the delaying section, the comparing section of a first set compares the output of the magnetic sensor element to a first threshold value, and
among the plurality of sets that each include the comparing section and the delaying section, the comparing section of a second set compares the output of the magnetic sensor element to a second threshold value that differs from the first threshold value.

(Item 13) The magnetic sensor apparatus according to Item 12, wherein
the first threshold value includes a first upper threshold value and a first lower threshold value indicating a predetermined first output range of the magnetic sensor element, and
the second threshold value includes a second upper threshold value that is smaller than the first upper threshold value and a second lower threshold value that is larger than the first lower threshold value indicating a predetermined second output range of the magnetic sensor element.

(Item 14) The magnetic sensor apparatus according to Item 12 or 13, wherein
the delaying section of the first set has a different delay amount than the delaying section of the second set.

(Item 15) The magnetic sensor apparatus according to Item 14, wherein
the delaying section of the first set has a smaller delay amount than the delaying section of the second set.

(Item 16) The magnetic sensor apparatus according to any one of Items 12 to 15, further comprising:
a delay circuit that delays the output of the magnetic sensor element, wherein
the comparing section of the second set compares an output of the delay circuit to the second threshold value.

(Item 17) The magnetic sensor apparatus according to Item 16, wherein
the delay circuit includes a filter that reduces noise.

(Item 18) The magnetic sensor apparatus according to any one of Items 12 to 17, further comprising:
a second malfunction judging section that judges whether there is a malfunction according to a result obtained by comparing the comparison result output by the comparing section or the delayed comparison result output by the delaying section in the first set of the comparing section and the delaying section to the comparison result output by the comparing section or the delayed comparison result output by the delaying section in the second set of the comparing section and the delaying section.

(Item 19) The magnetic sensor apparatus according to any one of Items 1 to 18, wherein
the magnetic sensor apparatus is implemented in a package that includes a first output terminal outputting an output signal of the amplifying section and a second output terminal outputting an output signal of the delaying section.

(Item 20) A magnetic sensor apparatus comprising:
a magnetic sensor element;
an amplifying section that amplifies and outputs an output of the magnetic sensor element;
a comparing section that compares the output of the magnetic sensor element to a threshold value;
an integral calculating section that calculates an integral of the amplified output of the magnetic sensor element, in response to a comparison result output by the comparing section being a predetermined logic value; and
an integral calculation notifying section that notifies to outside that an integral calculation result of the integral calculating section is outside a reference range.

(Item 21) A current sensor apparatus comprising:
a current path through which a current serving as a measurement target flows; and
the magnetic sensor apparatus according to any one of Items 1 to 20 that is arranged corresponding to the current path and detects a magnetic field generated according to the current serving as the measurement target.

What is claimed is:
1. A current sensor apparatus comprising:
a current path through which a current serving as a measurement target flows;
a magnetic sensor apparatus that is arranged corresponding to the current path and detects a magnetic field generated according to the current serving as the measurement target, the magnetic sensor apparatus comprising:
a magnetic sensor element;
an amplifying section that amplifies and outputs an output of the magnetic sensor element; and
a plurality of detecting sections,
a threshold value generating circuit that generates an upper threshold value and a lower threshold value,
wherein each of the plurality of detecting sections includes:
a set of (i) a comparing section that compares the output of the magnetic sensor element or an output of the amplifying section to a threshold value and (ii) a delaying section that delays and outputs a comparison result output by the comparing section, and
the comparing section of a first detecting section compares the output of the magnetic sensor element or the output of the amplifying section to a first threshold value,
the comparing section of a second detecting section compares the output of the magnetic sensor element or the output of the amplifying section to a second threshold value that differs from the first threshold value, and
the delaying section of the first detecting section has a different delay amount than the delaying section of the second detecting section,
wherein the comparing section of each detecting section includes:
a first comparing circuit that compares the output of the magnetic sensor element or the output of the amplifying section to the upper threshold value, a second comparing circuit that compares the output of the magnetic sensor element or the output of the amplifying section to the lower threshold value, and a logic circuit that is connected to the first comparing circuit and the second comparing circuit, and outputs a signal indicating whether the output of the magnetic sensor element or the output of the amplifying section exceeds the upper threshold value and whether the output of the magnetic sensor element or the output of the amplifying section is below the lower threshold value based on an output of the first comparing circuit and an output of the second comparing circuit, and wherein the magnetic sensor apparatus is implemented in a package that includes a first output terminal outputting an output signal of the amplifying section as a first output that is a magnetic field detection signal corresponding to a magnitude of the generated magnetic field, and one or more second output terminals that each output an output signal of a delaying section among the plurality of delaying sections as a second output that is a sensing signal that when the generated magnetic field is outside of a reference range provides notification to a control apparatus that detects an abnormality based on the sensing signal.

2. The current sensor apparatus according to claim 1, wherein
each delaying section includes a variable delay circuit and
the magnetic sensor apparatus further comprises a setting section that sets a delay amount of each variable delay circuit, according to instructions from outside.

3. The current sensor apparatus according to claim 2, wherein
each delaying section further includes a glitch filter that removes a glitch in the comparison result output by a corresponding comparing section, and
each variable delay circuit delays and outputs the comparison result that has passed through a corresponding glitch filter.

4. The current sensor apparatus according to claim 1, wherein
the magnetic sensor element is a Hall element that has a first terminal pair and a second terminal pair, and
the amplifying section includes a switching section that switches a terminal pair causing a drive current to flow and a terminal pair that senses the output of the magnetic sensor element, between the first terminal pair and the second terminal pair of the magnetic sensor element, according to a first clock supplied from outside.

5. The current sensor apparatus according to claim 4, further comprising:
a clock generating section that generates a second clock, which has a frequency that is an integer multiple of a frequency of the first clock and a predetermined phase difference relative to a timing of the first clock.

6. The current sensor apparatus according to claim 5, wherein
each comparing section compares the output of the magnetic sensor element or the output of the amplifying section to the threshold value, according to the second clock.

7. The current sensor apparatus according to claim 5, wherein
each delaying section delays the comparison result output by the corresponding comparing section, according to the second clock.

8. The current sensor apparatus according to claim 1, further comprising:
one or more integrating sections that each integrate the comparison result output by a corresponding comparing section or the delayed comparison result output by a corresponding delaying section; and
one or more integration notifying sections that correspond to the one or more integrating sections and each notify to outside that an integration result of the corresponding integrating section is outside a reference range.

9. The current sensor apparatus according to claim 1, wherein
the amplifying section amplifies the output of the magnetic sensor element, converts the amplified output into a digital signal, and outputs the digital signal, and
the magnetic sensor apparatus further comprises one or more first malfunction judging sections that each determine there is a malfunction in response to the digital signal not being a value corresponding to a logical value of the comparison result output by a corresponding comparing section or the delayed comparison result output by a corresponding delaying section.

10. The current sensor apparatus according to claim 1, wherein
the first threshold value includes a first upper threshold value and a first lower threshold value indicating a predetermined first output range of the magnetic sensor element, and
the second threshold value includes a second upper threshold value that is smaller than the first upper threshold value and a second lower threshold value that is larger than the first lower threshold value indicating a predetermined second output range of the magnetic sensor element.

11. The current sensor apparatus according to claim 1, wherein
the delaying section of the first detecting section among the plurality of detecting sections has a smaller delay amount than the delaying section of the second detecting section among the plurality of detecting sections.

12. The current sensor apparatus according to claim 1, wherein
the amplifying section further includes a delay circuit that delays the output of the magnetic sensor element, and
the comparing section of the second detecting section among the plurality of detecting sections compares an output of the delay circuit to the second threshold value.

13. The current sensor apparatus according to claim 12, wherein
the delay circuit includes a filter that reduces noise.

14. The current sensor apparatus according to claim 1, further comprising:
a second malfunction judging section that judges whether there is a malfunction according to a result obtained by comparing the comparison result output by the comparing section or the delayed comparison result output by the delaying section in the first detecting section among the plurality of detecting sections to the comparison result output by the comparing section or the delayed comparison result output by the delaying section in the second detecting section among the plurality of detecting sections.

15. The current sensor apparatus according to claim 1, wherein the threshold value generating circuit includes at least one variable resistor.

16. The current sensor apparatus according to claim 1, wherein the threshold value generating circuit includes:
- a first resistor whose one end is connected to a power supply voltage;
- a first variable resistor whose one end is connected to another end of the first resistor with a first connecting point; and
- a second resistor whose one end is connected to another end of the first variable resistor with a second connecting point, and whose another end is connected to a reference potential, wherein the first connecting point outputs the upper threshold value, and the second connecting point outputs the lower threshold value.

17. The current sensor apparatus according to claim 1, wherein the threshold value generating circuit includes:
- a first resistor whose one end is connected to a power supply voltage;
- a second resistor whose one end is connected to another end of the first resistor with a first connecting point; and
- a third resistor whose one end is connected to another end of the second resistor with a second connecting point, and whose another end is connected to a reference potential, wherein at least two resistors among the first resistor, the second resistor, and the third resistor have a variable resistance, the first connecting point outputs the upper threshold value, and the second connecting point outputs the lower threshold value.

18. The current sensor apparatus according to claim 1, wherein the logic circuit outputs a logical sum of the output of the first comparing circuit and the output of the second comparing circuit.

19. The current sensor apparatus according to claim 1, wherein the first comparing circuit and the second comparing circuit are comparators.

20. The current sensor apparatus according to claim 10, wherein the first upper threshold value and the second upper threshold value are greater than $V_{DD}/2$ and less than $V_{DD}$, and the first lower threshold value and the second lower threshold value are greater than $V_{SS}$ and less than $V_{DD}/2$, in which $V_{DD}$ is a power supply potential, and $V_{SS}$ is a reference potential.

21. A system comprising:
- the current sensor apparatus according to claim 1; and
- the control apparatus according to claim 1.

* * * * *